(12) United States Patent  
Uesaka et al.

(10) Patent No.: US 7,078,907 B2  
(45) Date of Patent: Jul. 18, 2006

(54) BATTERY CAPACITY CALCULATING METHOD, BATTERY CAPACITY CALCULATING APPARATUS AND BATTERY CAPACITY CALCULATING PROGRAM

(75) Inventors: Shinichi Uesaka, Kanagawa (JP); Takashi Tomita, Kanagawa (JP); Tsuyonobu Hatazawa, Tokyo (JP); Tamon Ikeda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/533,599

(22) PCT Filed: Nov. 5, 2003

(86) PCT No.: PCT/JP03/14116

§ 371 (c)(1),  
(2), (4) Date: May 3, 2005

(87) PCT Pub. No.: WO2004/046742

PCT Pub. Date: Jun. 3, 2004

(65) Prior Publication Data

US 2006/0022676 A1    Feb. 2, 2006

(30) Foreign Application Priority Data

Nov. 15, 2002  (JP)  .............................. 2002-331971

(51) Int. Cl.  
*G01N 27/416*    (2006.01)

(52) U.S. Cl. ........................ 324/429; 320/132; 324/427

(58) Field of Classification Search ................. 320/104, 320/132; 324/429, 427, 433; 702/63  
See application file for complete search history.

(56) References Cited

U.S. PATENT DOCUMENTS 5,691,078 A    11/1997    Kozaki et al.

FOREIGN PATENT DOCUMENTS

| JP | 53-29533 | 3/1978 |
|----|----------|--------|
| JP | 03-135303 | 6/1991 |
| JP | 08-088944 | 4/1996 |
| JP | 2000-147075 | 5/2000 |
| JP | 2002-303646 | 10/2002 |

*Primary Examiner*—Adolf Deneke Berhane  
*Assistant Examiner*—Aaron Piggush  
(74) *Attorney, Agent, or Firm*—Bell, Boyd & Llyod LLC

(57) ABSTRACT

A battery calculating method, apparatus, and program are provided. The battery capacity calculating method and apparatus can very accurately calculate a residual capacity of a secondary battery especially in the last stage of discharging independently of environmental conditions such as a temperature or a deteriorated state. the battery capacity calculating apparatus is equipped with a voltage measuring circuit which measures the terminal voltage ($V_{mea}$) of a battery at the time of discharging, a current measuring circuit which measures the current value (I) of the battery at the time of discharging, and a control circuit which calculates a residual capacity and/or residual power. The operation unit in the control circuit calculates a discharged capacity ($Q_{mea}$) and an apparent discharged capacity ($Q_{ocv}$) based on a terminal voltage ($V_{mea}$) and a current value (I) measured by the voltage measuring circuit and the current measuring circuit, respectively, estimates a discharge curve ($C_{pre}$) in the future including the last stage of discharging based on a capacity shift ($\Delta Q$) being the difference between the discharged capacity ($Q_{mea}$) and the apparent discharged capacity ($Q_{ocv}$) during discharging, and calculates the residual capacity and/or the residual power of the battery based on the estimated discharge curve ($C_{pre}$).

31 Claims, 10 Drawing Sheets

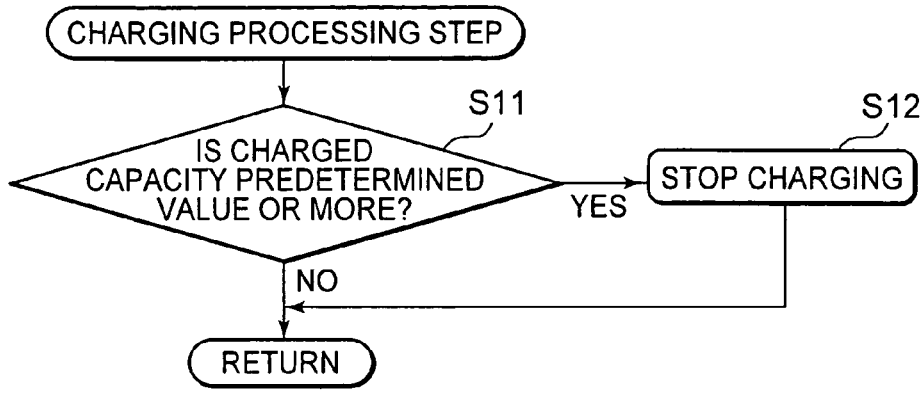
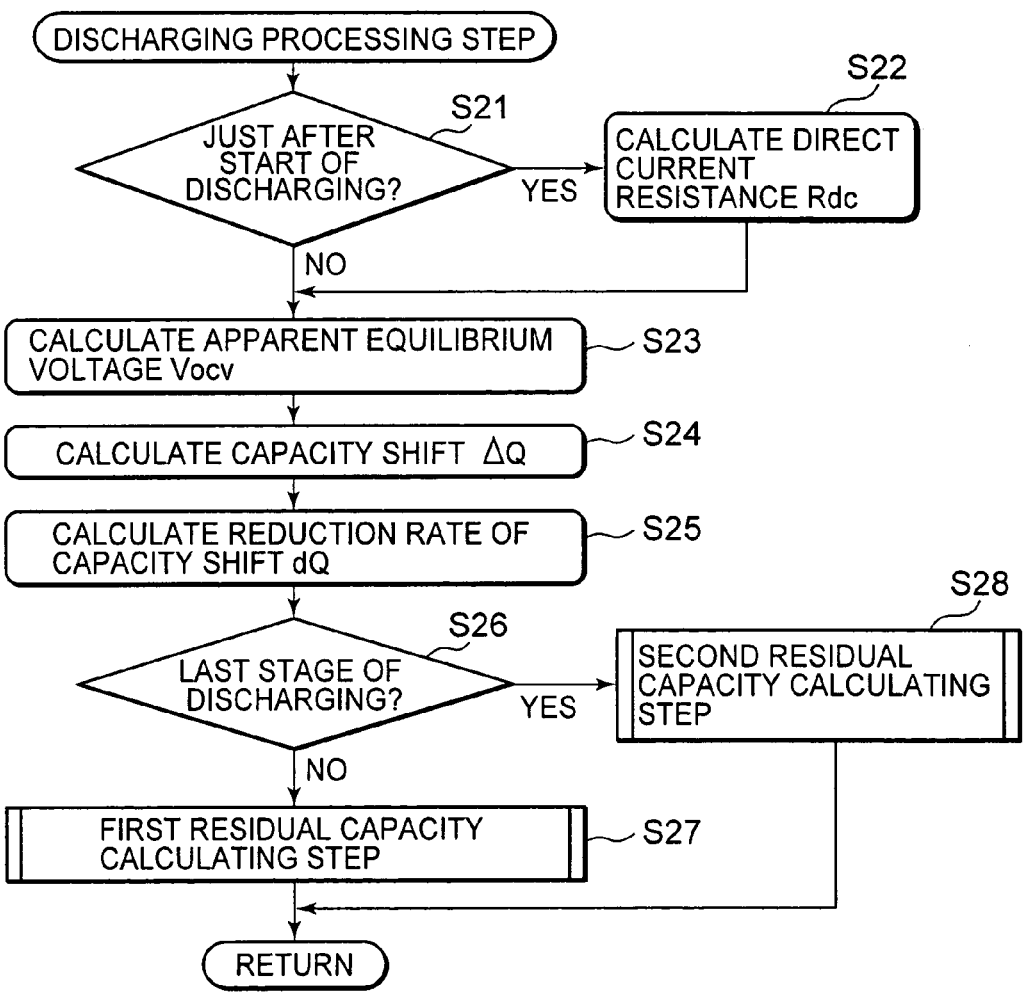

BATTERY CAPACITY CALCULATING METHOD, BATTERY CAPACITY CALCULATING APPARATUS AND BATTERY CAPACITY CALCULATING PROGRAM

CROSS REFERENCE TO RELATED APPLICATION

The present application claims priority to Japanese Patent Document No. 2002-331971 filed on Nov. 15, 2002, the disclosure of which is herein incorporated by reference.

BACKGROUND OF THE INVENTION

The present invention relates to a battery capacity calculating method, a battery capacity calculating apparatus and a battery capacity calculating program, all being for calculating residual capacities and/or residual power of a secondary battery.

For example, like a notebook type personal computer and a portable telephone, an electronic apparatus having a secondary battery (hereinafter simply referred to as a battery), such as a lithium ion secondary battery, as its power supply has been spread recently.

As a method for calculating a residual capacity of a battery, various methods have been proposed and examined. They are, for example, a method using a relation between terminal voltages and residual capacities of a battery, and a method of subtracting a discharged capacity obtained by integrating discharging currents from a fully charged capacity in the case where the discharged capacity at the time of the fully charged capacity is defined as "0".

Here, the relations between the terminal voltages and the residual capacities can be expressed by curves $C_{new}$ and $C_{old}$ along which the terminal voltages decrease to a predetermined discharge stopping voltage $V_{cut}$ as the residual capacities decrease, as shown in FIG. 16, for example. In particular, in a battery, the terminal voltage thereof has a tendency of falling rapidly when the residual capacity becomes in the neighborhood of "0", namely in the last stage of discharging. Accordingly, a predetermined discharge warning voltage $V_{war}$ is set in this region. Incidentally, in the drawing, a curve $C_{new}$ expresses the terminal voltages of an initial battery which has not deteriorated, and a curve $C_{old}$ expresses the terminal voltages of a deteriorated battery which has deteriorated by use. That is, in the battery, it is known that, when the battery was used for a long period of time and has been deteriorated, the relation between the terminal voltages and the residual capacities of the battery significantly changes, even if the discharging conditions are the same. Therefore, a problem of decreasing the estimation accuracy of the residual capacity is pointed out in a battery capacity calculating method using the above-mentioned relation between the terminal voltages and the residual capacities of a battery.

Accordingly, it is necessary to take into consideration a measure to the changes of the voltage characteristic owing to such a deterioration of a battery on calculating the residual capacity of the battery. As for the above-mentioned battery capacity calculating method of subtracting the discharged capacity obtained by integrating the discharging currents from the fully charged capacity, various methods have been examined as a method of coping with the changes of the voltage characteristic owing to the deterioration of a battery (see, for example, Japanese Patent Application Laid-Open Publications No. 2002-236154 and No. 2002-162452). They are, for example, a method of counting the number of the cycles of charging and discharging and correcting the fully charged capacity of a battery according to the counted number of the cycles, a method of correcting the fully charged capacity of a battery using a charged capacity until the battery becomes in its fully charged state, and the like.

Japanese Patent Application Laid-Open Publication No. 2002-236154 discloses "a residual capacity correcting method of a battery" as a method of counting the number of the cycles of charging and discharging to correct the fully charged capacity of the battery according to the counted number of the cycles. The Japanese Patent Application Laid-Open Publication No. 2002-236154 describes that not only the number of the cycles but also the display error of the residual capacity can be lessened, even if a battery is used after being saved for a long period of time, by correcting the fully charged capacity of the battery according to the saving state thereof.

Moreover, the Japanese Patent Application Laid-Open Publication No. 2002-162452 discloses "a battery residual quantity detecting circuit" as a method of correcting the fully charged capacity of a battery using a charged capacity until the battery becomes the fully charged state. The Japanese Patent Application Laid-Open Publication No. 2002-162452 describes that the residual capacity of a battery can be detected accurately by correcting fully charged capacity using the charged capacity to the fully charged state at the time of discharging to predetermined discharge warning voltage even if the voltage characteristic of the battery has changed.

However, the technique described in the Japanese Patent Application Laid-Open Publication No. 2002-236154 includes a problem in which a value different from the actual fully charged capacity is calculated owing to the variety of the actual use environments and the actual deterioration forms if the fully charged capacity is corrected using a correction coefficient measured in ideal environment.

Moreover, there are the following problems in the technique described in the Japanese Patent Application Laid-Open Publication No. 2002-162452.

Since an electronic apparatus connected to a battery usually shifts to the termination processing thereof with the battery having a residual capacity necessary for the termination processing, the discharge warning voltage is set to be higher rather than the original discharge stopping voltage of the battery. Here, although the discharge warning voltage is determined using the measured data of the initial battery, which has not deteriorated, the inclination of the curve in the last stage of discharging becomes gentle as the battery becomes deteriorated as shown in FIG. 16. In other words, the inclination of the discharge curve of a battery in the last stage of discharging, which shows the relation of the discharged capacities and the terminal voltages of the battery, becomes gentle as the battery becomes deteriorated. Consequently, even if the voltage of the deteriorated battery is the discharge warning voltage or less which has been determined based on an initial battery which has not deteriorated yet, a sufficient capacity remains in the deteriorated battery.

However, because the technique described in the Japanese Patent Application Laid-Open Publication No. 2002-162452 cannot lower the discharge warning voltage according to the deteriorated state of a battery, the fully charged capacity is underestimated. Then, there is a problem in which, even if a battery has not actually deteriorated so much, the residual capacity thereof is calculated too little, and the real use time of an electronic apparatus becomes shorter, as a result.

On the other hand, as a method of calculating the residual capacity of a battery from a viewpoint different from the method using the relation between the terminal voltages and the residual capacities and the method of subtracting the discharged capacity obtained by integrating the discharging currents from the fully charged capacity as discloses in the Japanese Patent Application Laid-Open Publications No. 2002-236154 and No. 2002-162452, there is a technique described in Japanese Patent Application Laid-Open Publication No. 2001-231179.

The Japanese Patent Application Laid-Open Publication No. 2001-231179 discloses "a battery capacity detecting method, and an apparatus and a battery pack" as a method of calculating a residual capacity using the internal impedance and the equilibrium voltage of a battery. Incidentally, the equilibrium voltage indicates a terminal voltage of a battery when the internal states of the electrode and the electrolytic solution of the battery become stable after the battery has been left in the state in which the terminals of the battery were opened for a long period of time. The Japanese Patent Application Laid-Open Publication No. 2001-231179 discloses a technique of measuring an equilibrium voltage curve which shows the relation of the discharged capacities and the equilibrium voltages of a deteriorated battery, and the internal impedance thereof to calculate the residual capacity of the battery based on the voltage drop by the internal impedance. The Japanese Patent Application Laid-Open Publication No. 2001-231179 also describes that the applicant of the application tried to calculate not only the residual capacity but also accurate residual power.

However, the technique described in the Japanese Patent Application Laid-Open Publication No. 2001-231179 includes the following problem.

The voltage drops $\Delta V$ owing to the internal impedance of a battery is expressed by the differences of the equilibrium voltage curve $C_{equ}$ and the discharge curve $C_{dch}$ as shown in FIG. 17. The internal impedance changes in dependence on discharged capacities, and significantly increases in the last stage of discharging. Therefore, in order to calculate residual capacities using the internal impedance, it becomes the most important matter to take into consideration the increase of the internal impedance in the last stage of discharging.

Now, it is known that the internal impedance of a battery also changes as the battery becomes deteriorated. The technique described in the Japanese Patent Application Laid-Open Publication No. 2001-231179, tries to calculate residual power by measuring the internal impedance suitably. In particular, in order to measure the increase of the internal impedance in the last stage of discharging, it is necessary to perform discharging completely till the last stage of discharging.

That is, because the technique described in the Japanese Patent Application Laid-Open Publication No. 2001-231179 cannot grasp the internal impedance in the last stage of discharging during discharging, the technique has a problem in which a residual capacity cannot be accurately estimated in the case where the internal impedance measured in advance has significantly changed in comparison with the present internal impedance such as a case where a battery begins to discharge from the state saved for a long period of time and a case where a battery has deteriorated by the repetition of charging and discharging at a shallow depth of a discharge.

As mentioned above, these various conventional battery capacity calculating method cannot previously estimate the discharge curve of a deteriorated battery especially in the last stage of discharging. Consequently, there is a problem in which, in the case where a residual capacity is calculated using the conventional battery capacity calculating method, the capacity of the battery cannot be used up completely and then the real use time of an electronic apparatus became shorter.

That is, the conventional battery capacity calculating methods severally have a contradictory problem in which the methods cannot calculate an accurate residual capacity until a battery has discharged almost completely, and it is needed to grasp the accurate residual capacity beforehand in order to perform almost complete discharging on the other hand. This fact means that the conventional battery capacity calculating methods are actually unrealizable.

Moreover, by the conventional battery capacity calculating methods, the situation of being unable to detect the true deteriorated state of a battery and detecting the deterioration of the battery excessively because the capacity of the battery cannot be used completely is also caused.

SUMMARY OF THE INVENTION

The present invention provides a battery capacity calculating method, a battery capacity calculating apparatus and a battery capacity calculating program, all capable of calculating the residual capacities of a battery very accurately especially in the last stage of discharging and prolonging the life of the battery independent of the environmental conditions of the battery such as the temperature and the deteriorated state of the battery.

A battery capacity calculating method according to an embodiment of the present invention is a battery capacity calculating method for calculating a residual capacity and/or residual power of a secondary battery, including: an equilibrium voltage curve calculating step for calculating an equilibrium voltage curve $C_{equ}$ showing a relation between a discharged capacity and an equilibrium voltage in the secondary battery; a voltage current measuring step for measuring a terminal voltage $V_{mea}$ and a current value I of the secondary battery at a time of discharging; a discharged capacity calculating step for calculating a discharged capacity $Q_{mea}$ of the secondary battery based on the terminal voltage $V_{mea}$ and the current value I, both measured at the voltage current measuring step; an apparent equilibrium voltage calculating step for calculating an apparent equilibrium voltage $V_{ocv}$ by adding a voltage drop $\Delta V_{dc}$ by a direct current resistance $R_{dc}$ to the terminal voltage $V_{mea}$; an apparent discharged capacity calculating step for calculating an apparent discharged capacity $Q_{ocv}$ corresponding to the apparent equilibrium voltage $V_{ocv}$ calculated at the equilibrium voltage calculating step based on the equilibrium voltage curve $Q_{equ}$ calculated at the equilibrium voltage curve calculating step; a capacity shift calculating step for calculating a capacity shift $\Delta Q$ being a difference between the discharged capacity $Q_{mea}$ and the apparent discharged capacity $Q_{ocv}$; and an estimating step for estimating a discharge curve $C_{pre}$ in a future based on the capacity shift $\Delta Q$ calculated at the capacity shift calculating step.

Such a battery capacity calculating method according to an embodiment of the present invention sequentially measures a terminal voltage $V_{mea}$ and a current value I at a time of discharging, calculates a discharged capacity $Q_{mea}$ and an apparent discharged capacity $Q_{ocv}$ based on the terminal voltage $V_{mea}$ and the current value I, and estimates a discharge curve $C_{pre}$ in a future including the last stage of discharging during discharging based on a capacity shift $\Delta Q$ being a difference between the discharged capacity $Q_{mea}$ and the apparent discharged capacity $Q_{ocv}$. Thereby, the battery capacity calculating method according to an embodiment of the present invention can obtain an accurate residual capacity and/or residual power, which could not calculated until the battery has almost completely discharged conventionally, during discharging.

To put it more concretely, at the estimating step, when a state of the battery is close to the last stage of discharging, a reduction rate dQ of a capacity shift to a discharged capacity is calculated based on the discharged capacity $Q_{mea}$ calculated at the discharged capacity calculating step and the capacity shift $\Delta Q$ calculated at the capacity shift calculating step, and the discharge curve $C_{pre}$ in the future is estimated based on the capacity shift $\Delta Q$ and the reduction rate dQ.

In this case, the capacity shift $\Delta Q$ is expressed by a linear function of the discharged capacity $Q_{mea}$ when the state of the battery is close to the last stage of discharging. Consequently, the discharge curve $C_{pre}$ in the future can be easily estimated.

On the other hand, at the estimating step, when a state of the battery is not in the last stage of discharging, the equilibrium voltage $V_{equ}$ corresponding to the discharged capacity $Q_{mea}$ is calculated based on the equilibrium voltage curve $C_{equ}$, and the discharge curve $C_{pre}$ in the future is estimated based on the voltage drop $\Delta V$ being the difference between the equilibrium voltage $V_{equ}$ and the terminal voltage $V_{mea}$.

Then, the battery capacity calculating method according to an embodiment of the present invention includes a switching step for performing a judgment whether a state of the battery is near the last stage of discharging or not based on the apparent equilibrium voltage $V_{ocv}$ to switch an estimating method of the discharge curve $C_{pre}$ according to a judgment result.

Thereby, the battery capacity calculating method according to an embodiment of the present invention becomes possible to estimate a discharge curve especially in the last stage of discharging very accurately during discharging.

Moreover, the battery capacity calculating apparatus according to an embodiment of the present invention is a battery capacity calculating apparatus for calculating a residual capacity and/or residual power of a secondary battery, including: voltage measuring means for measuring a terminal voltage $V_{mea}$ of the secondary battery at a time of discharging; current measuring means for measuring a current value I of the secondary battery at the time of discharging; and operation processing means for calculating the residual capacity and/or the residual power of the secondary battery, wherein the operation processing means calculates an equilibrium voltage curve $C_{equ}$ showing a relation between a discharged capacity and an equilibrium voltage in the secondary battery, calculates a discharged capacity $Q_{mea}$ of the secondary battery based on the terminal voltage $V_{mea}$ measured with the voltage measuring means and the current value I measured with the current measuring means, calculates an apparent equilibrium voltage $V_{ocv}$ by adding a voltage drop $\Delta V_{dc}$ by a direct current resistance $R_{dc}$ to the terminal voltage $V_{mea}$, calculates an apparent discharged capacity $Q_{ocv}$ corresponding to the apparent equilibrium voltage $V_{ocv}$ based on the equilibrium voltage curve $Q_{equ}$, calculates a capacity shift $\Delta Q$ being a difference between the discharged capacity $Q_{mea}$ and the apparent discharged capacity $Q_{ocv}$ and estimates a discharge curve $C_{pre}$ in a future based on the capacity shift $\Delta Q$.

Such a battery capacity calculating apparatus according to an embodiment of the present invention sequentially measures the terminal voltage $V_{mea}$ and the current value I at the time of discharging with the voltage measuring means and the current measuring means, respectively, and calculates a discharged capacity $Q_{mea}$ and an apparent discharged capacity $Q_{ocv}$ based on the terminal voltage $V_{mea}$ and the current value I with the operation processing means, and estimates a discharge curve $C_{pre}$ in the future including the last stage of discharging based on the capacity shift $\Delta Q$ being a difference between the discharged capacity $Q_{mea}$ and the apparent discharged capacity $Q_{ocv}$ with the operation processing means. Thereby, the battery capacity calculating apparatus according to an embodiment of the present invention can obtain the accurate residual capacity and/or the residual power, which could not calculated conventionally until the battery has discharged almost completely, during discharging.

Moreover, a battery capacity calculating program according to an embodiment of the present invention is a battery capacity calculating program capable of being executed by a computer for calculating a residual capacity and/or residual power of a secondary battery, including: equilibrium voltage curve calculating processing for calculating an equilibrium voltage curve $C_{equ}$ showing a relation between a discharged capacity and an equilibrium voltage of the secondary battery; voltage current measuring processing for measuring a terminal voltage $V_{mea}$ and a current value I of the secondary battery at a time of discharging; discharged capacity calculating processing for calculating a discharged capacity $Q_{mea}$ of the secondary battery based on the terminal voltage $V_{mea}$ and the current value I, both measured by the voltage current measuring processing; apparent equilibrium voltage calculating processing for calculating an apparent equilibrium voltage $V_{ocd}$ by adding a voltage drop $\Delta V_{dc}$ by a direct current resistance $R_{dc}$ to the terminal voltage $V_{mea}$; apparent discharged capacity calculating processing for calculating an apparent discharged capacity $Q_{ocv}$ corresponding to the apparent equilibrium voltage $V_{ocv}$ calculated by the equilibrium voltage calculating processing based on the equilibrium voltage curve $C_{equ}$ calculated by the equilibrium voltage curve calculating processing; capacity shift calculating processing for calculating a capacity shift $\Delta Q$ being a difference between the discharged capacity $Q_{mea}$ and the apparent discharged capacity $Q_{ocv}$; and estimating processing for estimating a discharge curve $C_{pre}$ in a future based on the capacity shift $\Delta Q$ calculated by the capacity shift calculating processing.

Such a battery capacity calculating program according to an embodiment of the present invention sequentially measures the terminal voltage $V_{mea}$ and the current value I at the time of discharging, calculates the discharged capacity $Q_{mea}$ and the apparent discharged capacity $Q_{ocv}$ based on the terminal voltage $V_{mea}$ and the current value I, and estimates the discharge curve $C_{pre}$ in the future including the last stage of discharging during discharging based on the capacity shift $\Delta Q$ being the difference between the discharged capacity $Q_{mea}$ and the apparent discharged capacity $Q_{ocv}$. Thereby, an apparatus provided with the battery capacity calculating program according to the present invention, can obtain an accurate residual capacity and/or residual power, which could not been calculated until the battery has discharged almost completely conventionally, during discharging.

Additional features and advantages of the present invention are described in, and will be apparent from, the following Detailed Description of the Invention and the figures.

BRIEF DESCRIPTION OF THE FIGURES

FIG. 11 is a flowchart illustrating the details of a charging processing step shown in FIG. 10.

FIG. 12 is a flowchart illustrating the details of a discharging processing step shown in FIG. 10.

DETAILED DESCRIPTION OF THE INVENTION

The present invention relates to a battery capacity calculating method, a battery capacity calculating apparatus and a battery capacity calculating program, all being for calculating residual capacities and/or residual power of a secondary battery.

In the following, various embodiments to which the present invention is applied is described in detail, referring to the attached drawings.

The present embodiment is a battery capacity calculating method for calculating residual capacities of a secondary battery such as a lithium ion secondary battery used as a power supply of an electronic apparatus such as a notebook type personal computer and a portable telephone. The present embodiment is based on the fact that the applicant of the present application had a knowledge that it was possible to estimate a discharge curve in the last stage of discharging very accurately despite during discharging by performing examinations of the characteristics of discharge curves in the last stage of discharging and the physicochemical phenomena in the inside of the secondary battery under various conditions, and by measuring the terminal voltages and the current values at the time of discharging. That is, the battery capacity calculating method sequentially measures the terminal voltages and the current values of a secondary battery, and estimates a discharge curve in future including the last stage of discharging during discharging based on the measured terminal voltages and the current values. Thereby, the battery capacity calculating method can obtain accurate residual capacities during discharging, which have not been able to be calculated conventionally until the secondary battery has discharged almost completely.

Incidentally, in the following, the secondary battery will be called as a battery simply in descriptions. Moreover, in the following descriptions, an equilibrium voltage indicates a terminal voltage at the time when the internal states of the electrode and the electrolytic solution of a battery becomes stable after leaving the battery for long period of time in the state in which the terminals of the battery is opened. An equilibrium voltage curve means a curve showing a relation between discharged capacities and equilibrium voltages. Furthermore, in the following descriptions, a discharge curve means a curve showing a relation between discharged capacities and terminal voltages, and the capacity at the time of a fully charged state is defined as "0" as for the discharged capacities.

Figure 1:
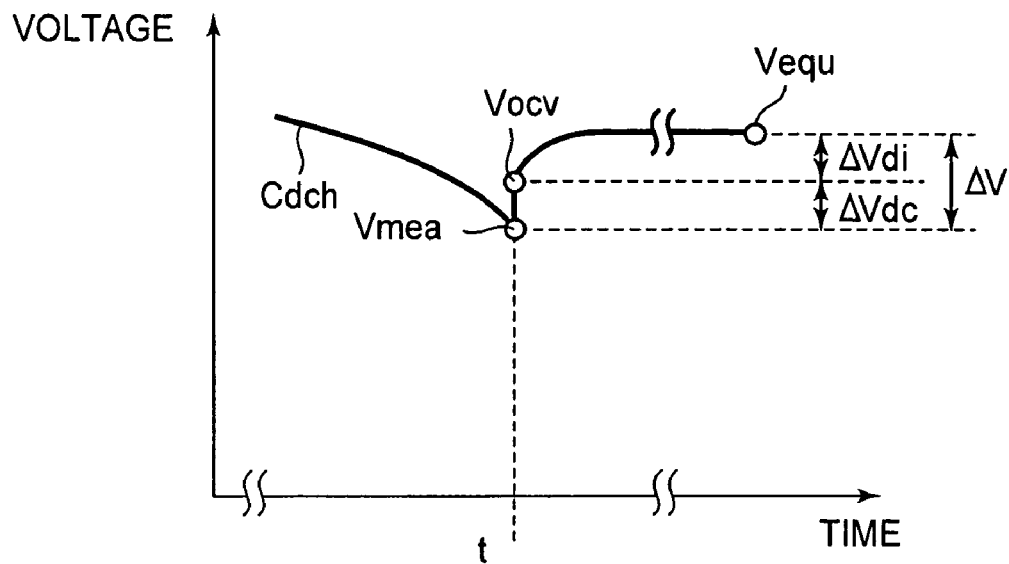
FIG. 1 is a view illustrating voltage changes at the time of stopping discharging, and is one for illustrating the principle of a battery capacity calculating method shown as an embodiment of the present invention.

First, in order to describe the principle of the battery capacity calculating method, FIG. 1 is used to describe a relation between an equilibrium voltage curve and a discharge curve.

In a battery, when it is discharging, the terminal voltage $V_{mea}$ thereof usually takes a value lower than that of the equilibrium voltage $V_{equ}$ thereof according to the current values at the time of discharging by the influence of the internal impedance of the battery.

Now, a case where discharging is stopped at a certain time t and the terminals of a battery are opened is examined as the time changes of the discharge curve $C_{dch}$ in that case is shown in the same figure. In this case, the terminal voltage increases gently in time after the terminal voltage has rapidly increased just after the stop of discharging. When the battery has been left as it is for a predetermined time, the terminal voltage accords with the equilibrium voltage $V_{equ}$.

This phenomenon shows that the internal impedance of a battery is divided roughly into two kinds, a component which instantaneously responds to a change of a current value and a component which responds tardily. Here, the voltage which has increased rapidly immediately after the stop of discharging is called as an apparent equilibrium voltage $V_{ocv}$. Moreover, the voltage drops $\Delta V$ ($=V_{equ}-V_{mea}$) expressed by differences between the equilibrium voltages $V_{equ}$ and the terminal voltages $V_{mea}$ at the time of discharging are classified into voltage drops $\Delta V_{dc}$ ($=V_{ocv}-V_{mea}$) and $\Delta V_{di}$ (=$V_{equ}$−$V_{ocv}$) according to the time constants of the voltage changes after the stop of discharging. The former is called as voltage drops $\Delta V_{dc}$ by a direct current resistance $R_{dc}$, and the latter is called as voltage drops $\Delta V_{di}$ by diffusion.

To put it concretely, the direct current resistance $R_{dc}$ is caused by electric resistances of the electrode and the electrolytic solution constituting the battery and an overvoltage generated at the interface between the electrode and the electrolytic solution. The voltage drops $\Delta V_{dc}$ by the direct current resistance $R_{dc}$ almost accord with the Ohm's law, and can be expressed by the products of current values I and the direct current resistance $R_{dc}$.

On the other hand, the voltage drops $\Delta V_{di}$ by the diffusion are caused by a concentration distribution of chemical materials carrying electric charges in the inside of the battery, and relates to the mobility of the electric charges in the inside of the electrolytic solution. Conversely, it is considerable that the phenomenon of a gentle rise of the terminal voltages by the voltage drops $\Delta V_{di}$ by the diffusion in time after the stop of discharging is caused by the fact that the phenomenon of returning the concentration distribution of the chemical material to be homogeneous is produced gently in time when the discharging is stopped in the state in which a deflection has been generated in the concentration distribution of the chemical material by the movement of electric charges at the time of the discharging. Since the concentration distribution of the chemical material in the inside of the battery is always changing during discharging, unlike the voltage drops $\Delta V_{dc}$ by the direct current resistance $R_{dc}$, the voltage drops $\Delta V_{di}$ by the diffusion cannot be expressed simply.

By the way, to calculate an accurate residual capacity of a battery is concentrated to estimate the discharge curve in the last stage of discharging accurately. The applicant of the present application ascertained by experiments that the increase of the internal impedance appearing in the last stage of discharging had a dominant factor in the component which responded tardily to the change of the current value between the two kinds of internal impedance components mentioned above. That is, the applicant ascertained that the increase of the internal impedance appearing in the last stage of discharging was a phenomenon produced by a rapid increase of the voltage drop $\Delta V_{di}$ by diffusion. Consequently, in order to estimate the discharge curve in the last stage of discharging accurately, it becomes the most important matter to estimate the voltage drop $\Delta V_{di}$ by the diffusion accurately.

Figure 2:
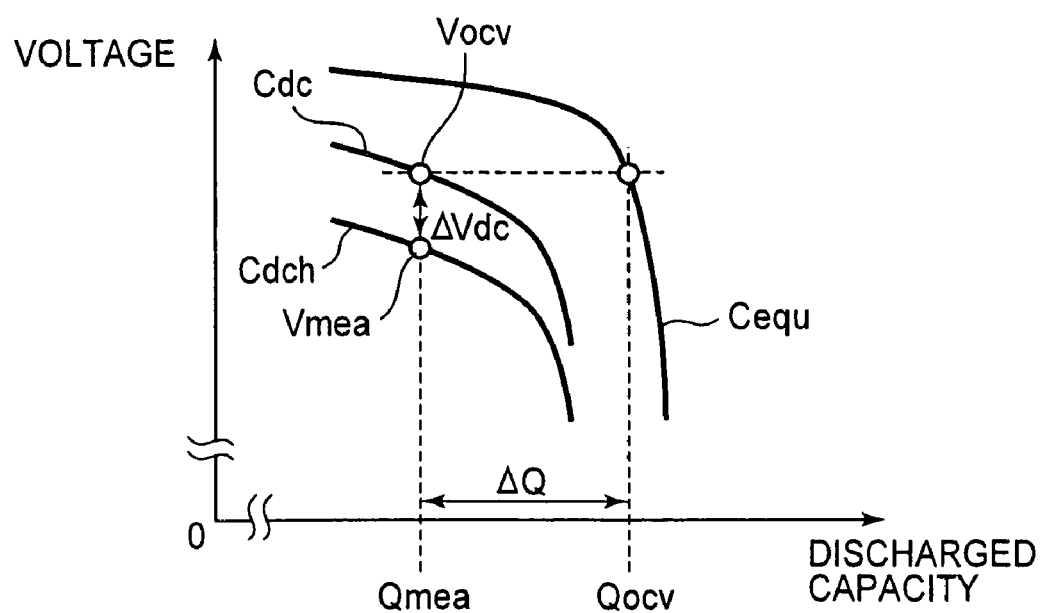
FIG. 2 is a view illustrating a relation of terminal voltages to discharged capacities at the time of discharging, and a relation of apparent discharged capacities to apparent equilibrium voltages.

Here, as shown in FIG. 2, the case where the terminal voltage is $V_{mea}$ when the discharged capacity is $Q_{mea}$ is considered, and the apparent equilibrium voltage $V_{ocv}$ obtained by adding the voltage drop $\Delta V_{dc}$ by the direct current resistance $R_{dc}$ to the terminal voltage $V_{mea}$ is noted. Moreover, the difference between a discharged capacity $Q_{ocv}$ corresponding to the apparent equilibrium voltage $V_{ocv}$ on the equilibrium voltage curve $C_{equ}$ and a present discharged capacity $Q_{mea}$ is defined as a capacity shift $\Delta Q$ (=$Q_{ocv}$−$Q_{mea}$). Since a curve $C_{dc}$ obtained by plotting the apparent equilibrium voltages $V_{ocv}$ and the equilibrium voltage curve $C_{equ}$ accord with each other in the case where no concentration distribution of the chemical material carrying electric charges in the inside of the battery has occurred at this time, namely in the case where the concentration distribution of the chemical material is homogeneous, the capacity shift $\Delta Q$ is "0". Consequently, the capacity shift $\Delta Q$ is considerable to be a measure showing the degree of the concentration distribution of the chemical material generated in the inside of the battery.

Figure 3:
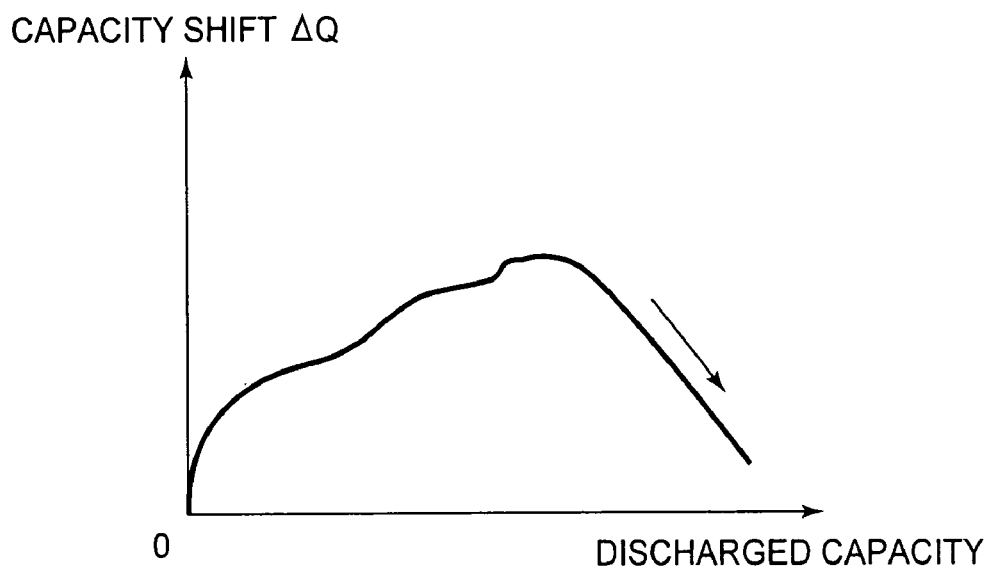
FIG. 3 is a view illustrating a relation between discharged capacities and capacity shifts.

Accordingly, the applicant of the present application obtained the relations between discharged capacities and the capacity shifts $\Delta Q$ in detail. Consequently, the applicant could obtain a knowledge that the relation between the discharged capacities and the capacity shifts $\Delta Q$ is one in which the capacity shifts $\Delta Q$ to the discharged capacities decreased almost linearly in the last stage of discharging as shown in FIG. 3 in the case where the load was fixed, even if the battery had any deteriorated state, any temperature, and any load. That is, the knowledge that the capacity shift $\Delta Q$ was expressed by a linear function ($\Delta Q = Q_{ocv} - Q_{mea} = a \cdot Q_{mea} + b$; a and b were severally a constant) of the discharged capacity $Q_{mea}$ was acquired. The fact can be considered that the concentration distribution of the chemical material in the inside of the battery produced by a discharge is reduced in the last stage of discharging.

Consequently, by sequentially measuring the capacity shifts $\Delta Q$ during discharging, and by calculating a linear reduction rate of the capacity shifts $\Delta Q$ to the discharged capacities in the last stage of discharging, the capacity shifts $\Delta Q$ in the future from that time point can be estimated easily, and consequently the apparent equilibrium voltages $V_{ocv}$ can be estimated. And a discharge curve in the future can be accurately estimated by subtracting the voltage drops $\Delta V_{dc}$ by the direct current resistance $R_{dc}$ from the estimated equilibrium voltages $V_{ocv}$.

Thus, the present invention notes the phenomenon of the voltage drops $\Delta V_{di}$ by the diffusion which increases rapidly in the last stage of discharging from a completely new viewpoint of not regarding the phenomenon as the changes of the voltage direction, but of regarding the phenomenon as the changes of the capacity direction of the capacity shifts $\Delta Q$. By estimating the capacity shifts $\Delta Q$ in the future, the present invention makes it possible to estimate an accurate discharge curve in a last stage of discharging, which has been impossible by the conventional methods, and especially makes it possible to accurately calculate the residual capacities in the last stage of discharging.

Now, in the following, the battery capacity calculating method based on such a principle is described.

The battery capacity calculating method is realizable by an apparatus composed of at least a circuit for measuring the terminal voltages of a battery and the currents flowing in the battery, and a control circuit for calculating residual capacities, though they are not shown here.

In the battery capacity calculating method, a storage unit which stores various kinds of information is provided in the inside of the control circuit, and the equilibrium voltage curves used in order to calculate the residual capacities are previously stored in the storage unit. The equilibrium voltage curves may be calculated beforehand to be stored in the storage unit, or may be expressed by functions using some approximation formulae to be stored in the storage unit. Furthermore, the equilibrium voltage curves may be stored in the storage unit as tables which match the discharged capacities and the equilibrium voltages.

Moreover, in the battery capacity calculating method, the direct current resistance $R_{dc}$ of a battery is calculated in advance of the calculation of the residual capacities at the time of discharging, and the calculated direct current resistance $R_{dc}$ is stored in the storage unit. The direct current resistance $R_{dc}$ may be measured at the time of charging. In the case where the values measured at the time of charging are used, there is the case where the temperature at the time of charging and the temperature at the time of discharging differ from each other. Consequently, there is the possibility of the necessity of performing troublesome processing of performing a temperature correction. Accordingly, in the battery capacity calculating method, the direct current resistance $R_{dc}$ is measured at the time of discharging. Of course, since temperature changes may arise during discharging in the battery capacity calculating method, the temperature compensation may be performed in consideration of the temperature changes. Incidentally, the direct current resistances $R_{dc}$ can be easily calculated as $R_{dc}=dV_{mea}/dI_{as}$ by measuring the changes $dV_{mea}$ and $dI$ of a voltage and a current before and after a large load change by using a chance at which the large load change is generated, for example, at the time of power-on of the electronic apparatus connected to the battery, or at the time of the activation of an arbitrary application in the case where the electronic apparatus is a personal computer or the like.

In such a battery capacity calculating method, when a battery is in a usage state, the terminal voltage $V_{mea}$ and the current value I which is flowing in the battery are sequentially measured, and the present discharged capacity $Q_{mea}$ is calculated by performing the integration of the currents. Moreover, in the battery capacity calculating method, the voltage drops $\Delta V_{dc}$ ($=I \cdot R_{dc}$) and the apparent equilibrium voltages $V_{ocv}$ ($=V_{mea}+\Delta V_{dc}=V_{mea}+I \cdot R_{dc}$) are calculated using the direct current resistance $R_{dc}$ stored in the storage unit, and further the apparent discharged capacities $Q_{ocv}$ are calculated using the equilibrium voltage curve stored in the storage unit to obtain the above-mentioned capacity shifts $\Delta Q$ ($=Q_{ocv}-Q_{mea}$). And in the battery capacity calculating method, the present discharged capacity $Q_{mea}$ and the capacity shift $\Delta Q$ are matched to be stored in the storage unit, and the reduction rate $dQ$ of the capacity shift $\Delta Q$ is calculated based on the discharged capacities $Q_{mea}$ and the capacity shifts $\Delta Q$ of the past several times.

Here, since the residual capacity calculation using the linearity of the reduction rate of the capacity shifts $\Delta Q$ previously shown in FIG. 3 catches the feature near the last stage of discharging, the method cannot be used except for the last stage of discharging. Accordingly, in the battery capacity calculating method, it is necessary to judge whether the present state is one close to the last stage of discharging or not during discharging, and to change the contents of processing according to the judgment.

Figure 4:
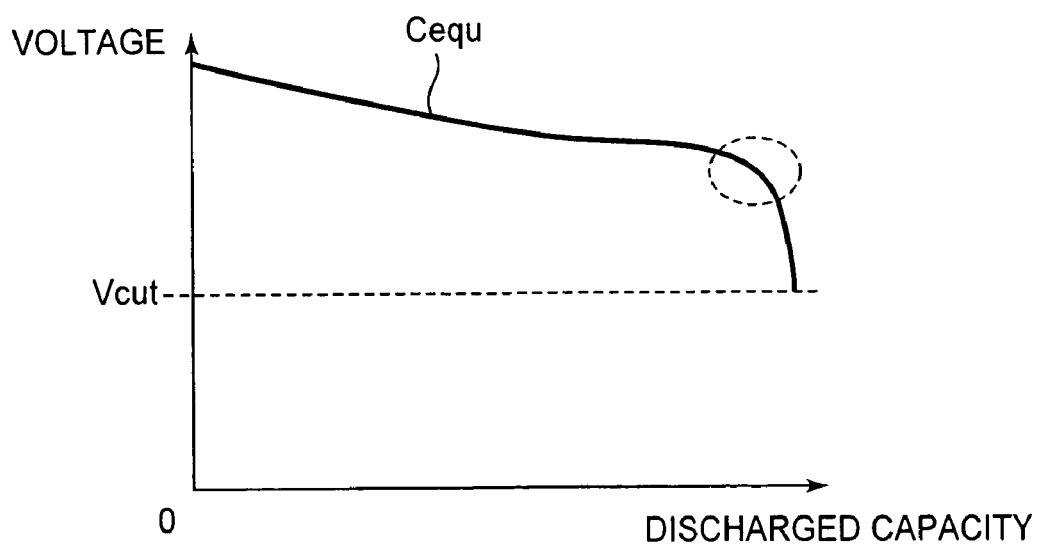
FIG. 4 is a view illustrating an equilibrium voltage curve showing a relation between discharged capacities and equilibrium voltages.

Then, in the battery capacity calculating method, it is judged whether a battery is in a state close to the last stage of discharging or not by comparing an apparent equilibrium voltage $V_{ocv}$ with a predetermined threshold value. The apparent equilibrium voltage $V_{ocv}$ is obtained by adding a voltage drop $\Delta_{dc}$ which is expressed by a product of the direct resistance $R_{dc}$ and the current value I to the terminal voltage $V_{mea}$ of the battery. This method is based on the fact that the applicant of the present application acquired the knowledge by experiments that the linear decrease of the capacity shifts $\Delta Q$ shown in FIG. 3 occurred when the apparent equilibrium voltages $V_{ocv}$ were the voltages near an inflection point at which the inclination of the equilibrium voltage curve changed rapidly, as shown in a dotted circle line part in FIG. 4. Of course, in the battery capacity calculating method, the judgment of whether the battery is in the state near the last stage of discharging or not may be performed based on a discharged capacity $Q_{mea}$, a measured terminal voltage $V_{mea}$ or a combination of them. Moreover, the state in which the reduction rates of the capacity shifts $\Delta Q$ become linear may be judged by detecting the state in which the values obtained by differentiating the obtained capacity shifts $\Delta Q$ by the discharged capacities $Q_{mea}$ become constant. In any case using either of the methods, in the battery capacity calculating method, there is no change in judging whether the state of a battery is one close to the last stage of discharging or not is judged using the linearity of the reduction rates of capacity shifts $\Delta Q$.

Figure 5:
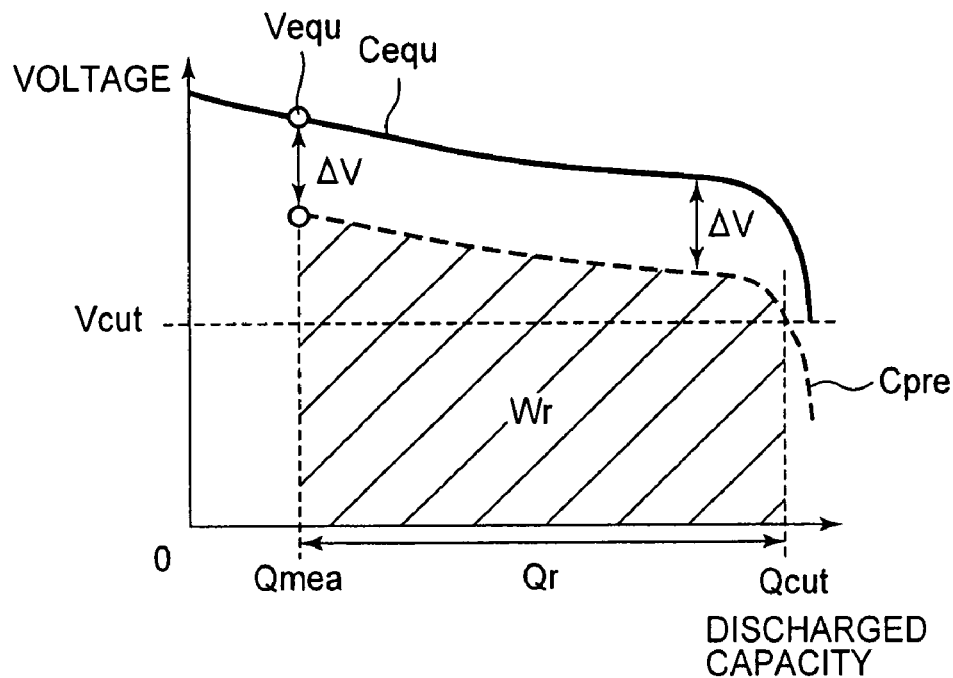
FIG. 5 is a view illustrating a relation between discharged capacities and voltages, and illustrates a method for calculating residual capacities and residual power based on voltage drops which are the differences of the terminal voltages at the time of discharging and the equilibrium voltages.

In the battery capacity calculating method, in the case where it is judged that the state of a battery is not in the last stage of discharging, as shown in FIG. 5, the present equilibrium voltage $V_{equ}$ is obtained from the present discharged capacity $Q_{mea}$, and the voltage drop $\Delta V$ at that time is calculated. For example, by subtracting the voltage drops $\Delta V$ from the equilibrium voltage curve $C_{equ}$, a discharge curve $C_{pre}$ in the future is estimated. And in the battery capacity calculating method, the difference between a discharged capacity $Q_{cut}$ until the estimated discharge curve $C_{pre}$ becomes less than the discharge stopping voltage $V_{cut}$ and the present discharged capacity $Q_{mea}$ is calculated as a residual capacity $Q_r$, and a value shown in an oblique line part in the same figure which value is obtained by integrating the voltages estimated by then is calculated as residual power $W_r$.

Incidentally, since the voltage drop $\Delta V$ is changed whenever a load changes in calculating residual capacity by such a method, the residual capacity changes. In order to avoid such changes, the discharge curve $C_{pre}$ in the future may be estimated using the maximum voltage drop $\Delta V_{max}$ corresponding to the maximum load by the present in the battery capacity calculating method. Moreover, in the case where a constant power discharge is assumed in the battery capacity calculating method, the current increases because the voltage are falling as performing discharging, and consequently the voltage drop becomes large. Then, the voltage drop $\Delta V$ in the future may be calculated in consideration of the increase of the voltage drop. Furthermore, in the case where an almost full discharge could be performed in the past, a calculated residual capacity may be corrected using the capacity and the power which have actually discharged at that time in the battery capacity calculating method.

Figure 6:
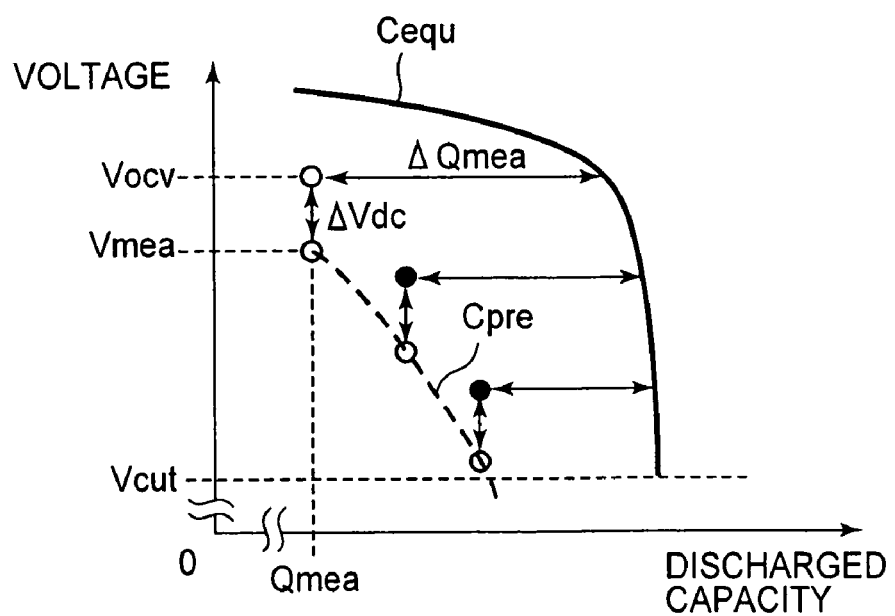
FIG. 6 is a view illustrating a relation between discharged capacities and voltages, and illustrates a method for estimating a discharge curve in the last stage of discharging based on apparent equilibrium voltages obtained by correcting terminal voltages at the time of discharging and capacity shifts, and for calculating residual capacities and residual power.

On the other hand, in the battery capacity calculating method, when a battery is judged to be one in a state near the last stage of discharging, as shown in FIG. 6, based on the present capacity shift $\Delta Q_{mea}$ and the reduction rate $dQ$ of a capacity shift, namely using the feature of capacity shift $\Delta Q$ to be expressed by a linear function of the discharged capacity $Q_{mea}$ ($\Delta Q=Q_{ocv}-Q_{mea}=a-Q_{mea}+b$; a and b are severally a constant), apparent equilibrium voltages in the future shown by the black dots in the same figure are estimated, and by subtracting the voltage drops $\Delta V_{dc}$ by the direct current resistance $R_{dc}$ from the apparent equilibrium voltages, a discharge curve $C_{pre}$ in the future is estimated. And in the battery capacity calculating method, the residual capacities $Q_r$ and the residual power $W_r$ are calculated almost like the above-mentioned case where it is judged that the battery is not in the sate of the last stage of discharging. At this time, in the battery capacity calculating method, as for the future current values I, the present current value and the maximum current value by the present may be assumed to be fixed in the future, or the present power and the present maximum power may be assumed to be fixed in the future for taking into consideration the changes of the current values.

Figure 7:
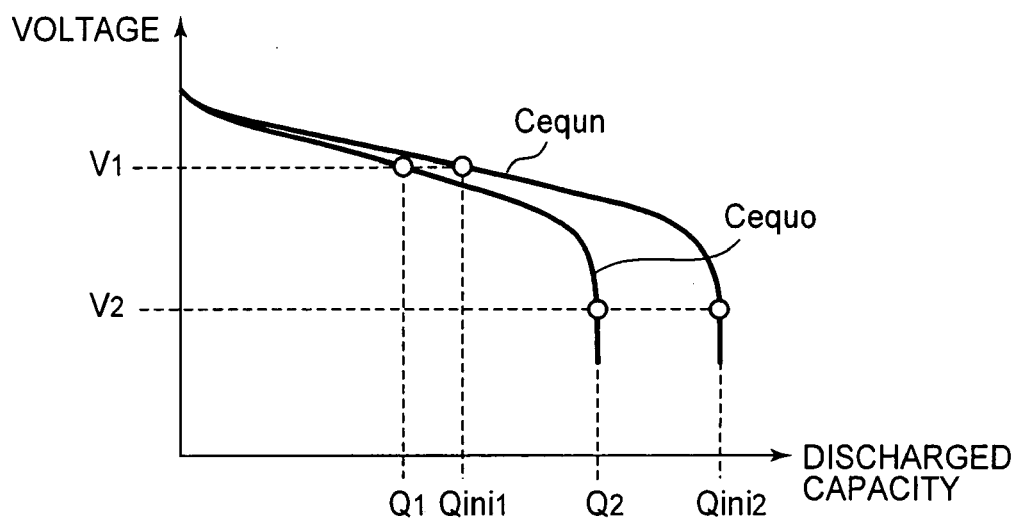
FIG. 7 is a view illustrating an equilibrium voltage curve of an initial battery and an equilibrium voltage curve of a deteriorated battery, and illustrates a method for obtaining an equilibrium voltage curve of a deteriorated battery based on shrinkage ratios.

Incidentally, in the battery capacity calculating method, as described above, it is necessary to obtain an equilibrium voltage curve in advance of the calculation of a residual capacity. Since the equilibrium voltage curve usually changes as the battery becomes deteriorated, it is necessary not to obtain the equilibrium voltage curve of an initial battery which has not deteriorated, but to obtain the equilibrium voltage curve of the deteriorated battery in the present state. Here, it is noted that the shapes of the equilibrium voltage curves of an initial battery and a deteriorated battery become almost similar figures, for example, as shown in FIG. 7. Incidentally, in the same figure, a curve $C_{equn}$ shows an equilibrium voltage curve in an initial battery which has not deteriorated, and a curve $C_{equo}$ shows an equilibrium voltage curve in a deteriorated battery which has deteriorated by use. That is, the equilibrium voltage curve $C_{equo}$ of the deteriorated battery presents a form shrunk into one direction, maintaining the form of the equilibrium voltage curve $C_{equn}$ of the initial battery.

Accordingly, in the battery capacity calculating method, based on the fact that the equilibrium voltage curves $Cequ_n$ and $C_{equo}$ become almost similar figures to each other, the equilibrium voltage curve $C_{equn}$ is previously grasped, and the equilibrium voltages of the deteriorated battery at least at two points and the capacity between the equilibrium voltages are obtained. Thereby, a shrinkage ratio S in the capacity direction of the equilibrium voltage curve, namely "the fully charged capacity of a deteriorated battery/the fully charged capacity of an initial battery", can be calculated. For example, in the battery capacity calculating method, as shown in the same figure, if the equilibrium voltages of the obtained two points in the deteriorated battery are denoted by $V_1$ and $V_2$ and the discharged capacities corresponding to these equilibrium voltages $V_1$ and $V_2$ are denoted by $Q_1$ and $Q_2$ ($Q_2>Q_1$), respectively, the shrinkage ratio S can be calculated as $(Q_2-Q_1)/(Q_{ini2}-Q_{ini1})$ by obtaining discharged capacities $Q_{ini1}$ and $Q_{ini2}$ at the time when the equilibrium voltages on the equilibrium voltage curve $C_{equn}$ are $V_1$ and $V_2$. In the battery capacity calculating method, based on the shrinkage ratio S, the equilibrium voltage curve $C_{equo}$ of a deteriorated battery can be obtained to be stored in the storage unit.

Moreover, in the battery capacity calculating method, as a method for obtaining an equilibrium voltage, the following methods can be also used: a method for obtaining the equilibrium voltage based on a voltage in a pause state in which a user of the battery performs neither charging nor discharging, a method for compulsorily stopping charging to estimate an equilibrium voltage from the voltage changes after that, and the like. It is desirable to increase an opportunity of obtaining the equilibrium voltage by using these both methods together in the battery capacity calculating method, especially.

Figure 8:
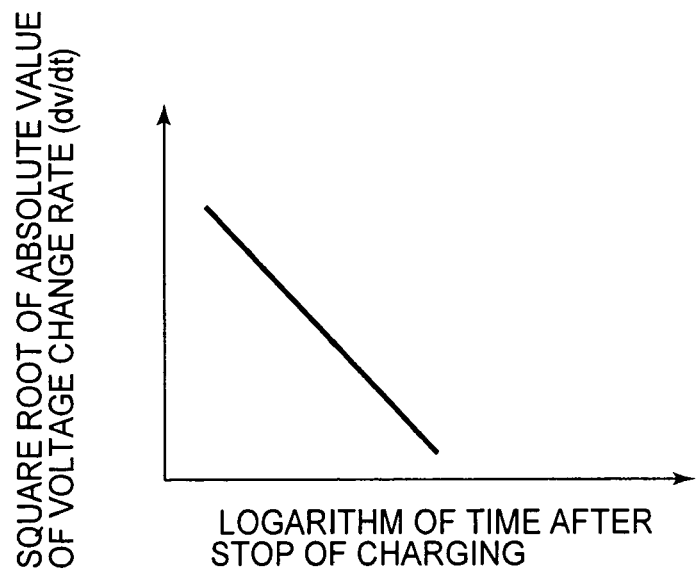
FIG. 8 is a view illustrating a state in which the square roots of the absolute values of voltage change rates almost linearly decrease to the logarithms of the times from a charging stop in the case where the charging is stopped compulsorily.

Incidentally, when charging is stopped compulsorily, for example, as shown in FIG. 8, the square roots of the absolute values of voltage change rates (dV/dt) decrease almost linearly to the logarithms of times from a charging stop. This knowledge was obtained by experiments by the applicant of the present application. Consequently, this method enables it to estimate equilibrium voltages based on the voltage changes in a short time after a charging stop.

However, because it is necessary to make the capacity between equilibrium voltages to be obtained at least at two points sufficiently large at the time of the calculation of the shrinkage ratio S, the sufficiently accurate calculation is difficult in the case where charging and discharging in a shallow depth of discharge are repeated. But, as described above, it has been ascertained by experiments that, in the battery capacity calculating method, by performing the residual capacity calculation utilizing the reduction rate of the capacity shifts ΔQ, the residual capacities in the last stage of discharging can be calculated with a sufficient accuracy even in such a case.

Now, in the following, descriptions are given to a concrete battery capacity calculating apparatus for calculating the residual capacities of a battery as a power supply of a predetermined electronic apparatus by applying such a battery capacity calculating method thereto. Incidentally, in the following, for the convenience of description, the descriptions are given to a battery capacity calculating apparatus which calculates residual capacities of a lithium ion secondary battery having the following features. That is, the fully charged voltage thereof is 4.2 V, the discharge stopping voltage thereof is 3.0 V, the nominal capacity thereof is 1800 mAh, the diameter thereof is 18 mm and the length thereof is 65 mm. Moreover, in the following, the descriptions are performed on the supposition such that the current values at the time of discharging are positive, and the current values at the time of charging are negative.

Figure 9:
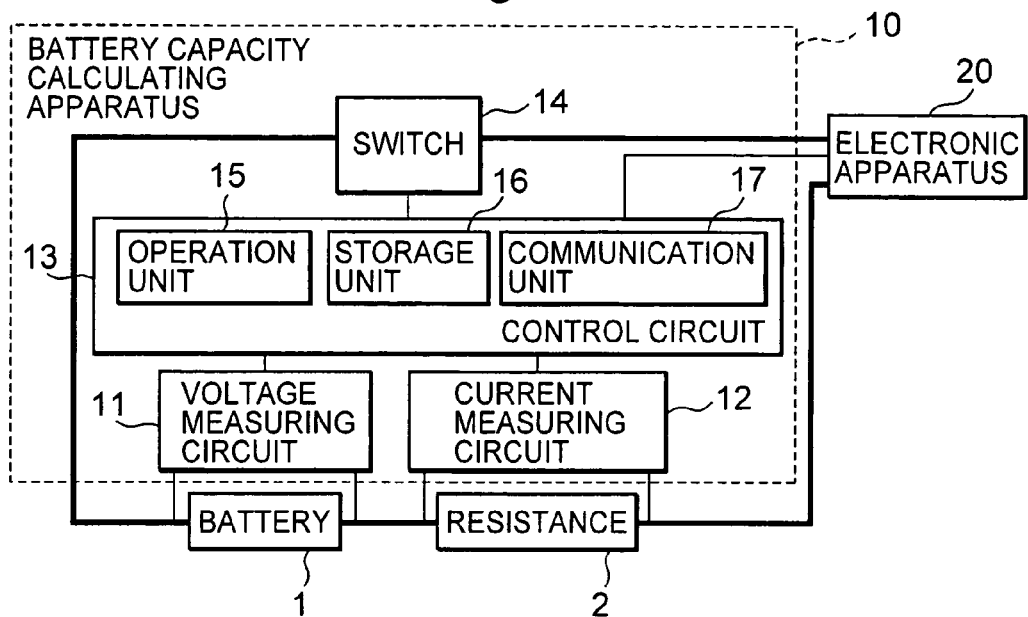
FIG. 9 is a block diagram illustrating a concrete battery capacity calculating apparatus to which the same battery capacity calculating method is applied.

As described above, the battery capacity calculating apparatus is composed of at least a circuit for measuring the terminal voltage of a battery and the current flowing in the battery, and a control circuit which calculates residual capacities. To put it concretely, for example, as shown in FIG. 9, a battery capacity calculating apparatus 10 is equipped with a voltage measuring circuit 11 measuring a terminal voltage of a battery 1 as a power supply of an electronic apparatus 20, a current measuring circuit 12 measuring the current flowing in the battery 1, a control circuit 13 calculating residual capacities and/or residual power, and a switch 14 switching the stop or the start of charging to the battery 1.

Incidentally, the battery capacity calculating apparatus 10 consisting of each of these units may be constituted as the so-called battery pack independently of the electronic apparatus 20 using the battery 1, or may be installed in the electronic apparatus 20 including the battery 1. Furthermore, as for the battery capacity calculating apparatus 10, only the battery 1 may be configured independently of the electronic apparatus 20.

The voltage measuring circuit 11 measures the terminal voltage of the battery 1. The voltage measuring circuit 11 converts the obtained terminal voltage being an analog value into a digital value using an analog to digital (A/D) converter, which is not shown, and the voltage measuring circuit 11 supplies the converted digital value to the control circuit 13.

The current measuring circuit 12 measures the current flowing in the battery 1 by measuring the voltage between both the ends of the resistance 2 of, for example, 20 mΩ, which is connected in series to the battery 1. The current measuring circuit 12 converts the voltage between the both ends of the resistance 2 being an analog value into a digital value using, for example, an A/D converter, which is not shown, and the current measuring circuit 12 supplies the converted digital value to the control circuit 13.

The control circuit 13 includes an operation unit 15 such as a microprocessor, which performs various operations, a storage unit 16 storing various kinds of information rewritably, and a communication unit 17 performing the giving and the receiving of various kinds of information with the electronic apparatus 20.

The control circuit 13 previously stores the equilibrium voltage curves of the battery 1 as an object the residual capacities of which are calculated in the storage unit 16. As mentioned above, the equilibrium voltage curves may be calculated beforehand to be stored in the storage unit 16, or may be expressed as functions using some approximation formulae to be stored in the storage unit 16. Furthermore, the equilibrium voltage curves may be stored in the storage unit 16 as tables in which discharged capacities and equilibrium voltages are matched. Incidentally, the equilibrium voltage curves are set to be calculated in advance to be stored in the storage unit 16 here.

To put it concretely, in the battery capacity calculating apparatus 10, the battery 1 is placed in a predetermined charging and discharging device, and is charged up to 4.2 V by performing constant current charging, for example, by a charging current of 1 A. After that, by performing constant voltage charging by a voltage of 4.2 V for 3 hours, the battery 1 is charged to a fully charged voltage. And in the battery capacity calculating apparatus 10, discharging is performed by a predetermined discharged capacity in a condition such as discharging a current of 1 A for 10 minutes, and after that the terminal of the battery 1 is opened. Then, the battery 1 is left as it is until the terminal voltage is stabilized to obtain an equilibrium voltage. In the battery capacity calculating apparatus 10, by repeatedly performing such a measurement until the terminal voltage turns into a predetermined discharging stopping voltage, i.e. 3.0 V, an equilibrium voltage curve is obtained. Incidentally, the time until the terminal voltage is stabilized is required to be at least 30 minutes or more.

The control circuit 13 stores in advance the equilibrium voltage curve obtained in such a way in the storage unit 16. And the control circuit 13 calculates the residual capacity and/or the residual power of the battery 1 with the operation unit 15 based on the voltage supplied from the voltage measuring circuit 11 and the current value calculated from the voltage supplied from the current measuring circuit 12. The control circuit 13 transmits the residual capacity and/or the residual power which have been calculated to the electronic apparatus 20 through the communication unit 17. The control circuit 13 may also detects the deteriorated state of the battery I at this time to transmit the information to the electronic apparatus 20 through the communication unit 17.

The switch 14 is provided for stopping or starting charging based on the control signal supplied from the control circuit 13, and creates a pause state compulsorily during charging.

Figure 10:
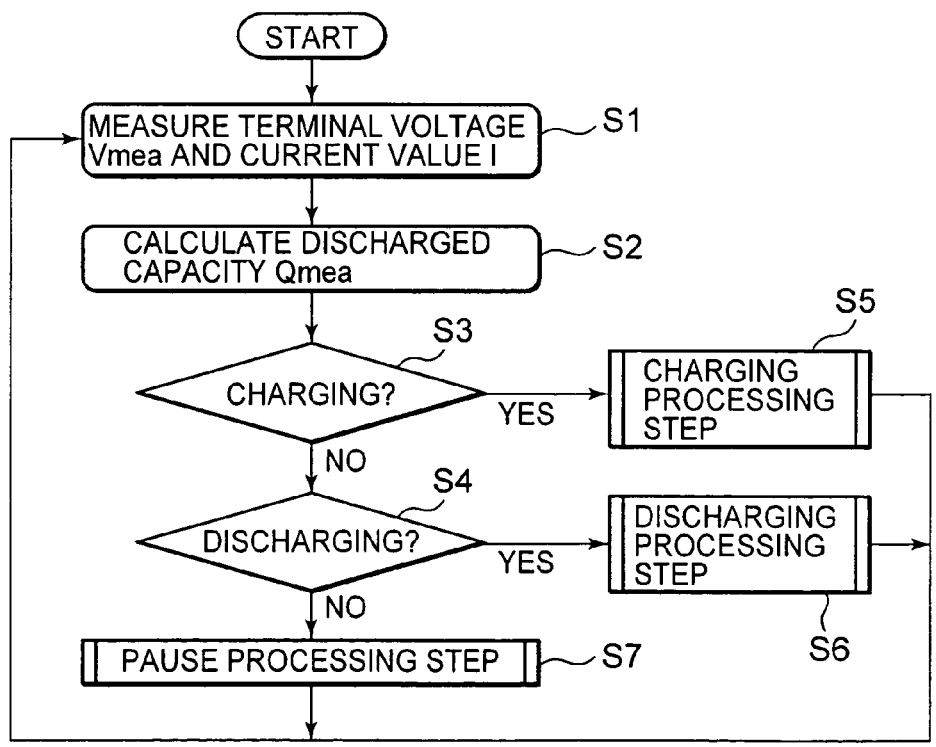
FIG. 10 is a flowchart illustrating a series of processing at the time of calculating the residual capacities and the residual power of a battery in the same battery capacity calculating apparatus.

Such a battery capacity calculating apparatus 10 calculates the residual capacity and/or the residual power of the battery 1 by passing through a series of steps as shown in FIG. 10. Incidentally, the processing of Step S1 to Step S4 in the same figure is repeatedly performed at a fixed period Δt of, for example, 1 second, or is performed irregularly. Here, the processing of Step S1 to Step S4 is set to be performed repeatedly at a fixed period Δt.

First, as shown in the same figure, the battery capacity calculating apparatus 10 measures a terminal voltage $V_{mea}$ with the voltage measuring circuit 11, and measures a current value I with the current measuring circuit 12 at Step S1. Then, the battery capacity calculating apparatus 10 acquires the terminal voltage $V_{mea}$ and the current value I with the control circuit 13.

Successively, at Step S2, with the operation unit 15 in the control circuit 13, the battery capacity calculating apparatus 10 performs capacity integration, and calculates the present discharged capacity $Q_{mea}$ (=$Q_{old}$-I×Δt). Here, the reference mark $Q_{old}$ denotes the discharged capacity calculated at the last time.

Successively, at Step S3, the battery capacity calculating apparatus 10 judges whether charging is being performed or not based on the current value I by the operation part with the operation unit 15 in the control circuit 13. When the battery capacity calculating apparatus 10 judges that the current value I is negative, the battery capacity calculating apparatus 10 judged that charging is being performed, and shifts the processing thereof to the charging processing step at Step S5.

On the other hand, when the battery capacity calculating apparatus 10 judges that the current value I is not negative, the battery capacity calculating apparatus 10 shifts the processing thereof to Step S4, and judges whether discharging is being performed or not based on the current value I with the operation unit 15 in the control circuit 13. When the battery capacity calculating apparatus 10 judges that the current value I is positive, the battery capacity calculating apparatus 10 judges that discharging is being performed, and shifts the processing thereof to the discharging processing step at Step S6. When the battery capacity calculating apparatus 10 judges that the current value I is not positive, that is, the battery capacity calculating apparatus 10 judges that the current value I is neither positive nor negative, but is "0", the battery capacity calculating apparatus 10 shifts the processing thereof to the pause processing step at Step S7.

And the battery capacity calculating apparatus 10 repeats the processing from Step S1 again, after ending any one of the charging processing step at Step S5, the discharging processing step at Step S6 and the pause processing step at Step S7. The battery capacity calculating apparatus 10 can calculate the residual capacity and/or the residual power of the battery 1 during discharge by repeatedly carrying out such a series of steps.

In the following, each of the charging processing step at Step S5, the discharging processing step at Step S6, and the pause processing step at Step S7 is described in detail.

First, the charging processing step at Step S5 is described.

When the processing of the battery capacity calculating apparatus 10 has shifted to the charging processing step, as shown in FIG. 11, at Step S11, the battery capacity calculating apparatus 10 judges whether or not the charged capacity is a predetermined value or more with the operation unit 15 in the control circuit 13. For example, the battery capacity calculating apparatus 10 judges whether 500 mAh or more of charged capacity has been charged from a charging start or from the forced termination of charging.

Here, when the battery capacity calculating apparatus 10 has judged that the charged capacity is not equal to or more than the predetermined value, the battery capacity calculating apparatus 10 ends the series of charging processing steps as it is, and the battery capacity calculating apparatus 10 shifts the processing thereof to Step S1 in FIG. 10.

On the other hand, when the battery capacity calculating apparatus 10 has judged that the charged capacity is equal to the predetermined value or more, the battery capacity calculating apparatus 10 supplies a control signal from the control circuit 13 to the switch 14 to stop charging compulsorily at Step S12 in FIG. 11, and then the battery capacity calculating apparatus 10 ends the series of charging processing steps to shift the processing thereof to Step S1 in FIG. 10.

By passing through such a charging processing step, the battery capacity calculating apparatus 10 can produce a pause state compulsorily during charging, and it becomes possible to estimate the equilibrium voltage using the pause state as described above.

Next, the discharging processing step at Step S6 is described.

When the battery capacity calculating apparatus 10 has shifted to the discharging processing step, as shown in FIG.

12, at Step S21, the battery capacity calculating apparatus 10 judges whether the state is one immediately after the start of discharging or not with the operation unit 15 in the control circuit 13.

Here, when the battery capacity calculating apparatus 10 has judged that the sate is not the one immediately after the start of discharging, the battery capacity calculating apparatus 10 shifts the processing thereof to Step S23. On the other hand, when the battery capacity calculating apparatus 10 has judged that the sate is one immediately after the start of discharging, at Step S22, the battery capacity calculating apparatus 10 calculates the direct current resistance $R_{dc}$ (=$dV_{mea}/dI$=($V_b$-$V_a$)/$\Delta I$) with the operation unit 15 in the control circuit 13 using the terminal voltage $V_b$ just before the start of discharging and the terminal voltage $V_a$ immediately after the start of discharging, both measured with the voltage measuring circuit 11, and the current value change $\Delta I$ at that time based on the current value I measured with the current measuring circuit 12. Incidentally, at this time, the battery capacity calculating apparatus 10 may calculate the direct current resistance $R_{dc}$ using an average voltage and an average current value calculated during a period of, for example, 5 seconds after the start of discharging. When the battery capacity calculating apparatus 10 has calculated the direct current resistance $R_{dc}$, the battery capacity calculating apparatus 10 shifts the processing thereof to Step S23.

Successively, at Step S23, the battery capacity calculating apparatus 10 calculates the apparent equilibrium voltage $V_{ocv}$ (=$V_{mea}$+$\Delta V_{dc}$=$V_{mea}$+$I \cdot R_{dc}$) by adding the product of the direct current resistance $R_{dc}$ and the current value I to the terminal voltage $V_{mea}$ with the operation unit 15 in the control circuit 13.

Successively, the battery capacity calculating apparatus 10 refers to the equilibrium voltage curve $C_{equ}$ stored in the storage unit 16 with the operation unit 15 in the control circuit 13 at Step S24, and calculates the apparent discharged capacity $Q_{ocv}$ corresponding to the apparent equilibrium voltage $V_{ocv}$. Furthermore, the battery capacity calculating apparatus 10 calculates the capacity shift $\Delta Q$ (=$Q_{ocv}$-$Q_{mea}$) which is the difference between the present discharged capacity $Q_{mea}$ obtained at Step S2 in FIG. 10 and the apparent discharged capacity $Q_{ocv}$, and the battery capacity calculating apparatus 10 matches the present discharged capacity $Q_{mea}$ and the capacity shift $\Delta Q$ to store them in the storage unit 16. Incidentally, in order to reduce the storage capacity of the storage unit 16, it is not necessary for the battery capacity calculating apparatus 10 to perform Step S24 whenever the battery capacity calculating apparatus 10 measures a voltage and a current, Step S24 may be executed only when the discharged capacity has increased to 10 or more mAhs, for example.

Successively, at Step S25 in FIG. 12, the battery capacity calculating apparatus 10 reads the discharged capacity $Q_{mea}$ and the capacity shift $\Delta Q$, which have been stored in the storage unit 16 in the control circuit 13, with the operation unit 15 by the amount of the past 50 mAh of discharged capacity, for example. And, for example, the battery capacity calculating apparatus 10 performs regression analysis based on a plurality of discharged capacities $Q_{mea}$ and the capacity shifts $\Delta Q$, the battery capacity calculating apparatus 10 calculates the reduction rates dQ of the capacity shifts to the discharged capacities, and stores the calculated reduction rates dQ in the storage unit 16.

Then the battery capacity calculating apparatus 10 judges whether the state is close to one in the last stage of discharging or not with the operation unit 15 in the control circuit 13 at Step S26. In this case the battery capacity calculating apparatus 10 can judge whether the state is one close to the last stage of discharging or not using various methods as mentioned above. Here, it is supposed that the battery capacity calculating apparatus 10 judges whether the state is the one close to the last stage of discharging or not by comparing the apparent equilibrium voltage $V_{ocv}$ with the threshold value of 3.6 V, for example.

When the battery capacity calculating apparatus 10 has judged that the apparent equilibrium voltage $V_{ocv}$ is larger than the threshold value, the battery capacity calculating apparatus 10 judges that the state is not the one in the last stage of discharging, and shifts the processing thereof to the first residual capacity calculating step at Step S27. On the other hand, when the battery capacity calculating apparatus 10 has judged that the apparent equilibrium voltage $V_{ocv}$ is equal to the threshold value or less, the battery capacity calculating apparatus 10 judges that the state is one near the last stage of discharging, and shifts the processing thereof to the second residual capacity calculating step at Step S28.

Here, the first residual capacity calculating step at Step S27 and the second residual capacity calculating step at Step S28 are described.

First, the first residual capacity calculating step is described.

Figure 13:
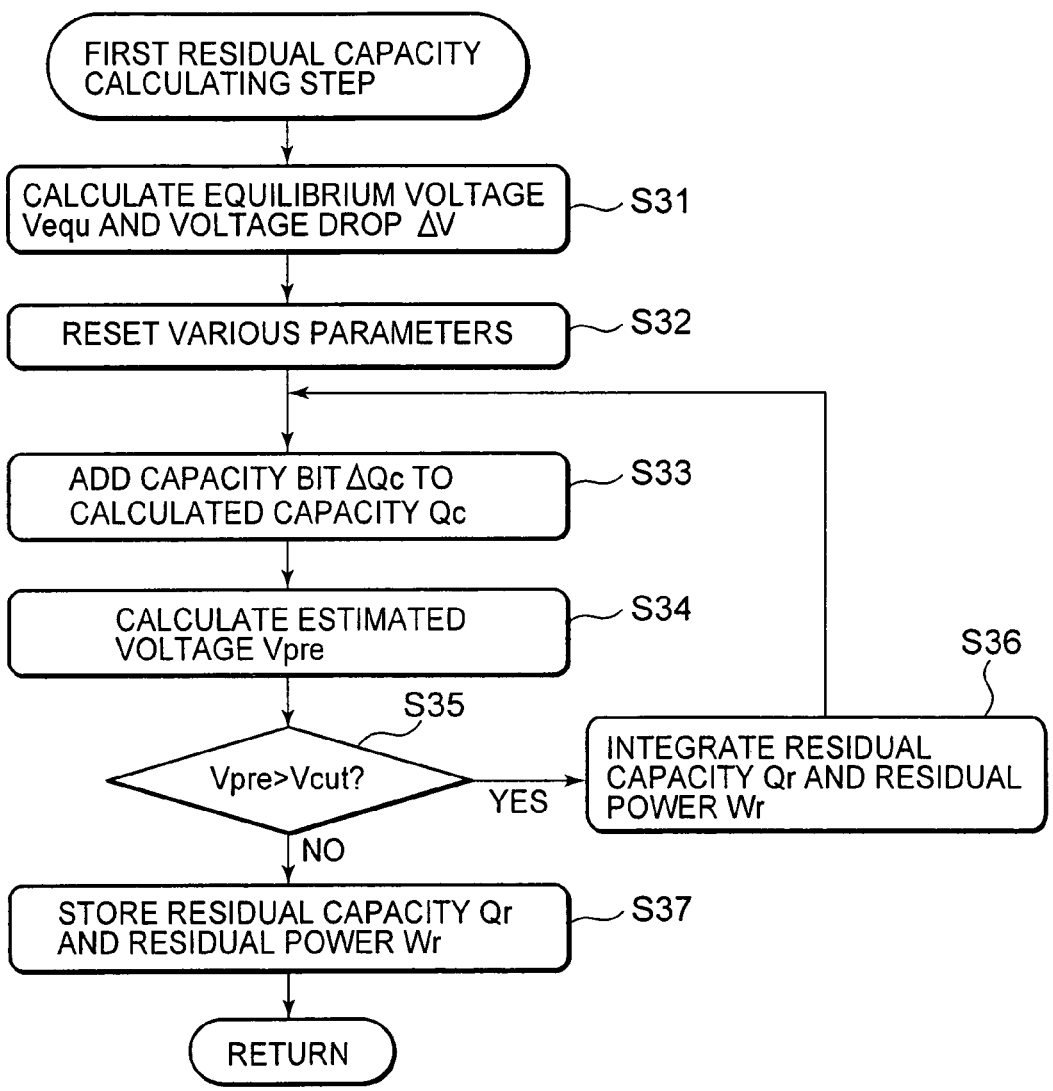
FIG. 13 is a flowchart illustrating the details of a first residual capacity calculating step shown in FIG. 12.

When the battery capacity calculating apparatus 10 has shifted to the first residual capacity calculating step, as shown in FIG. 13, at Step S31, the battery capacity calculating apparatus 10 referrers to the equilibrium voltage curve $C_{equ}$ stored in the storage unit 16 with the operation unit 15 in the control circuit 13, and calculates the equilibrium voltage $V_{equ}$ corresponding to the present discharged capacity $Q_{mea}$. Furthermore, the battery capacity calculating apparatus 10 calculates the voltage drop $\Delta V$ (=$V_{equ}$-$V_{mea}$), which is the difference of the calculated equilibrium voltage $V_{equ}$ and the present terminal voltage $V_{mea}$.

Successively, the battery capacity calculating apparatus 10 resets and initializes various parameters at Step S32. To put it concretely, the battery capacity calculating apparatus 10 sets the residual capacity $Q_r$ and the residual power $W_r$ to "0", and sets the present discharged capacity $Q_{mea}$ as a calculated capacity $Q_c$.

Successively, at Step S33, the battery capacity calculating apparatus 10 adds a predetermined quantity, e.g. 1 mAh, of the capacity bit $\Delta Q_c$ to the calculated capacity $Q_c$ with the operation unit 15 in the control circuit 13, and updates the calculated capacity $Q_c$.

Successively, the battery capacity calculating apparatus 10 refers to the equilibrium voltage curve $C_{equ}$ stored in the storage unit 16 with the operation unit 15 in the control circuit 13 at Step S34 to calculate the equilibrium voltage $V_{equ}$ corresponding to the calculated capacity $Q_c$ updated at Step S33. Then, the battery capacity calculating apparatus 10 calculates the estimated voltage $V_{pre}$ (=$V_{equ}$-$\Delta V$) by subtracting the voltage drop $\Delta V$ calculated at Step S31 from the calculated equilibrium voltage $V_{equ}$. Thereby, the battery capacity calculating apparatus 10 can estimate the discharge curve $C_{pre}$ in the future.

And the battery capacity calculating apparatus 10 judges whether the estimated voltage $V_{pre}$ is larger than the discharge stopping voltage $V_{cut}$ or not by comparing the estimated voltage $V_{pre}$ with the discharge stopping voltage $V_{cut}$ (=3.0 V) with the operation unit 15 in the control circuit 13 at Step S35.

Here, when the battery capacity calculating apparatus 10 has judged that the estimated voltage $V_{pre}$ is larger than the discharge stopping voltage $V_{cut}$, the battery capacity calculating apparatus 10 shifts the processing thereof to Step S36.

Then, the battery capacity calculating apparatus 10 adds the capacity bit $\Delta Q_c$ to the residual capacity $Q_r$ until that time with the operation unit 15 in the control circuit 13, and adds the product of the capacity bit $\Delta Q_c$ and the equilibrium voltage $V_{equ}$ to the residual power $W_r$ until that time. Then, the battery capacity calculating apparatus 10 repeats the processing from Step S33.

On the other hand, when the battery capacity calculating apparatus 10 has judged that the estimated voltage $V_{pre}$ is equal to the discharge stopping voltage $V_{cut}$ or less, the battery capacity calculating apparatus 10 outputs the residual capacities $Q_r$ and the residual power $W_r$ until that time, and stores them in the storage unit 16 in the control circuit 13 at Step S37. Moreover, as the need arises, the battery capacity calculating apparatus 10 transmits the residual capacities $Q_r$ and the residual power $W_r$ to the electronic apparatus 20 through the communication unit 17, and then the battery capacity calculating apparatus 10 ends the series of the first residual capacity calculating step.

As described above, when the battery capacity calculating apparatus 10 has judged that the state is not one in the last stage of discharging, the battery capacity calculating apparatus 10 calculates the voltage drop $\Delta V$, which is the difference between the present equilibrium voltage $V_{equ}$ and the terminal voltage $V_{mea}$, and calculates the estimated voltage $V_{pre}$ by subtracting the voltage drop $\Delta V$ from the equilibrium voltage $V_{equ}$. Thereby, the battery capacity calculating apparatus 10 can estimate the discharge curve $C_{pre}$ in the future, and can calculate the residual capacity $Q_r$ and the residual power $W_r$. Incidentally, the battery capacity calculating apparatus 10 calculates the residual capacities $Q_r$ and the residual power $W_r$ sequentially. The battery capacity calculating apparatus 10 may be set not to transmit the residual capacities $Q_r$ and the residual power $W_r$ sequentially to the electronic apparatus 20, but to calculate the average value of the past several times with the operation unit 15 in the control unit 13, and to transmit the average value to the electronic apparatus 20 through the communication unit 17.

In the following, the second residual capacity calculating step is described.

Figure 14:
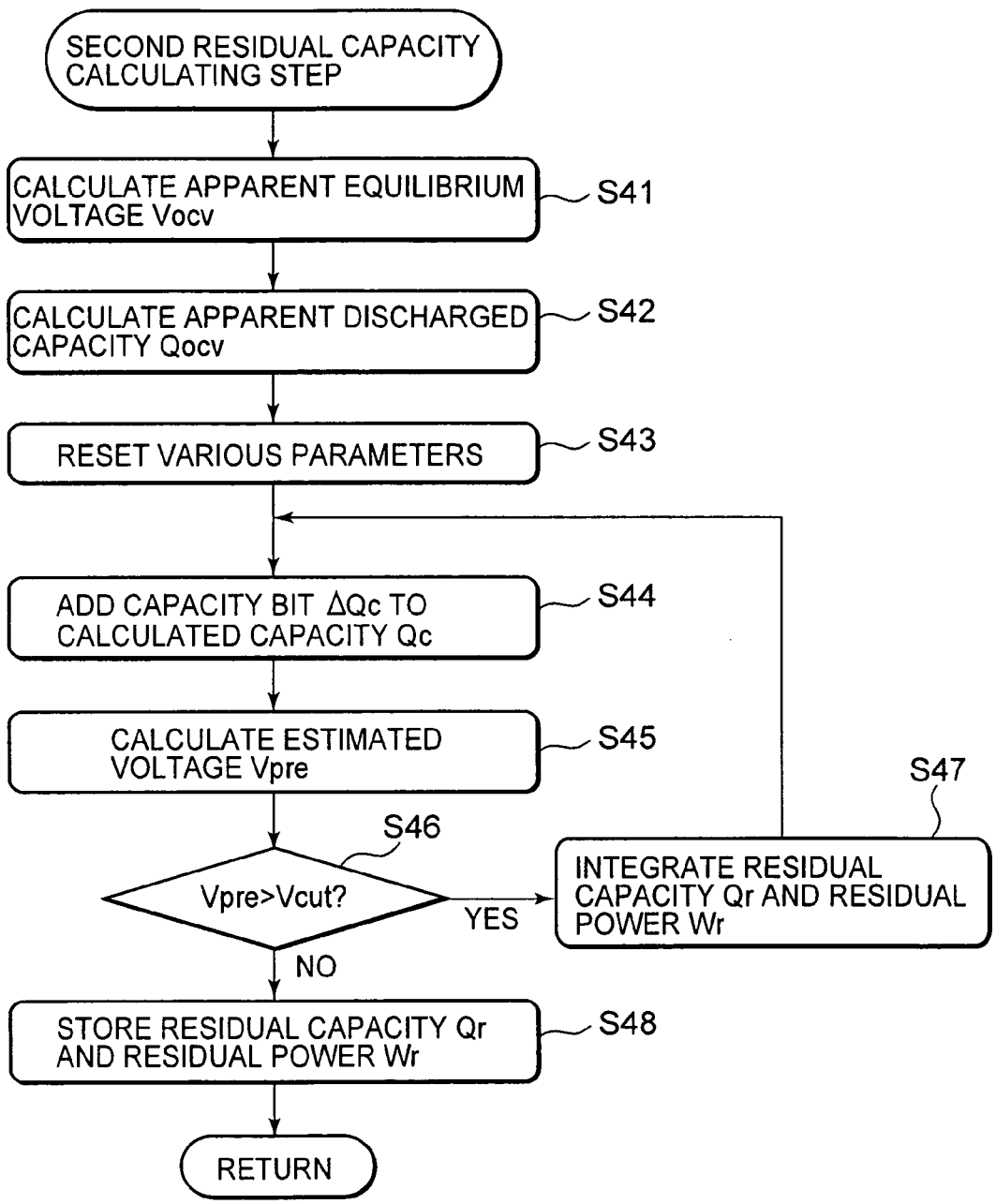
FIG. 14 is a flowchart illustrating the details of a second residual capacity calculating step shown in FIG. 12.

When the battery capacity calculating apparatus 10 has shifted to the second residual capacity calculating step, as shown in FIG. 14, the battery capacity calculating apparatus 10 calculates the apparent equilibrium voltage $V_{ocv}$ (=$V_{mea}$+$\Delta V_{dc}$=$V_{mea}$+$I \cdot R_{dc}$) in the present discharged capacity $Q_{mea}$ by adding the product of the direct current resistance $R_{dc}$ and the current value I to the terminal voltage $V_{mea}$ with the operation unit 15 in the control circuit 13 at Step S41.

Successively, the battery capacity calculating apparatus 10 referrers to the equilibrium voltage curve $C_{equ}$ stored in the storage unit 16 by the operation unit 15 in the control circuit 13 to calculate the apparent discharged capacity $Q_{ocv}$ corresponding to the apparent equilibrium voltage $V_{ocv}$ at Step S42.

Successively, the battery capacity calculating apparatus 10 resets and initializes various parameters at Step S43. To put it concretely, the battery capacity calculating apparatus 10 sets the residual capacity $Q_r$ and the residual power $W_r$ to "0", and sets the present apparent discharged capacity $Q_{ocv}$ as the calculated capacity $Q_c$.

Successively, at Step S44, the battery capacity calculating apparatus 10 adds a predetermined quantity, e.g. 1 mAh, of the capacity bit $\Delta Q_c$ to the calculated capacity $Q_c$ with the operation unit 15 in the control circuit 13, and updates the calculated capacity $Q_c$.

Successively, at Step S45, the battery capacity calculating apparatus 10 refers to the equilibrium voltage curve $C_{equ}$ stored in the storage unit 16 by the operation unit 15 in the control circuit 13, and calculates the apparent equilibrium voltage $V_{ocv}$ corresponding to the calculated capacity $Q_c$ updated at Step S44. Furthermore, the battery capacity calculating apparatus 10 calculates the estimated voltage $V_{pre}$ (=$V_{ocv}$−$R_{dc}$×I) by subtracting the voltage drop by the direct current resistance $R_{dc}$ from the calculated apparent equilibrium voltage $V_{ocv}$. Thereby, the battery capacity calculating apparatus 10 can estimate the discharge curve $C_{pre}$ in the last stage of discharging.

And the battery capacity calculating apparatus 10 judges whether the estimated voltage $V_{pre}$ is larger than the discharge stopping voltage $V_{cut}$ or not by comparing the estimated voltage Vpre with the discharge stopping voltage $V_{cut}$ (=3.0 V) with the operation unit 15 in the control circuit 13 at Step S46.

Here, when the battery capacity calculating apparatus 10 has judged that the estimated voltage $V_{pre}$ is larger than the discharge stopping voltage $V_{cut}$ the battery capacity calculating apparatus 10 shifts the processing thereof to Step S47. The battery capacity calculating apparatus 10 adds $\Delta Q_c/(1-dQ)$ to the residual capacities $Q_r$ until that time with the operation unit 15 in the control circuit 13, and adds the product of $\Delta Q_c/(1-dQ)$ and the estimated voltage $V_{pre}$ to the residual power Wr until that time. Then, the battery capacity calculating apparatus 10 repeats the processing from Step S44.

On the other hand, when the battery capacity calculating apparatus 10 has judged that the estimated voltage $V_{pre}$ is equal to the discharge stopping voltage $V_{cut}$ or less, at Step S48, the battery capacity calculating apparatus 10 outputs the residual capacities $Q_r$ and the residual power $W_r$ until that time to store the outputted residual capacities $Q_r$ and the residual power $W_r$ in the storage unit 16 in the control circuit 13. Moreover, as the need arises, the battery capacity calculating apparatus 10 transmits the residual capacities $Q_r$ and the residual power $W_r$ to the electronic apparatus 20 through the communication unit 17, and the series of the second residual capacity calculating steps is ended.

As described above, when the battery capacity calculating apparatus 10 has judged that the state is one near the last stage of discharging, the battery capacity calculating apparatus 10 calculates the apparent equilibrium voltage $V_{ocv}$ at the present discharged capacity $Q_{mea}$ and the discharged capacity $Q_{ocv}$ and calculates the estimated voltage $V_{pre}$ by subtracting the voltage drop by the direct current resistance $R_{dc}$ from the apparent equilibrium voltage $V_{ocv}$. Thereby, the battery capacity calculating apparatus 10 can estimate the discharge curve $C_{pre}$ in the future, and can calculate the residual capacity $Q_r$ and the residual power $W_r$ based on the present capacity shift $\Delta Q_{mea}$ and the reduction rate dQ of a capacity shift. Incidentally, the battery capacity calculating apparatus 10 calculates the residual capacities $Q_r$ and the residual power $W_r$ sequentially. But, the battery capacity calculating apparatus 10 may not sequentially transmit the residual capacities Qr and the residual power Wr to the electronic apparatus 20, but as described above, the battery capacity calculating apparatus 10 may calculate the average value of the past several times with the operation unit 15 in the control circuit 13, and may transmit the average value to the electronic apparatus 20 through the communication unit 17.

In the discharging processing step shown in FIG. 12, the battery capacity calculating apparatus 10 switches the first residual capacity calculating step and the second residual capacity calculating step to perform it according to the judgment of the state whether the state is one close to the last stage of discharging or not. After the battery capacity calculating apparatus 10 has passed through the first residual capacity calculating step in Steps S27, or the second residual capacity calculating step in Step S28, the battery capacity calculating apparatus 10 ends the series of the discharging processing steps, and shifts the processing thereof to Step S1 in FIG. 10.

The battery capacity calculating apparatus 10 can calculate the residual capacities $Q_r$ and the residual power $W_r$ during discharging by passing through such a discharging processing step. In particular, the battery capacity calculating apparatus 10 can calculate the residual capacities $Q_r$ and the residual power $W_r$ very accurately by shifting to the second residual capacity calculating step in the last stage of discharging.

The pause processing step in Step S7 is described finally.

Figure 15:
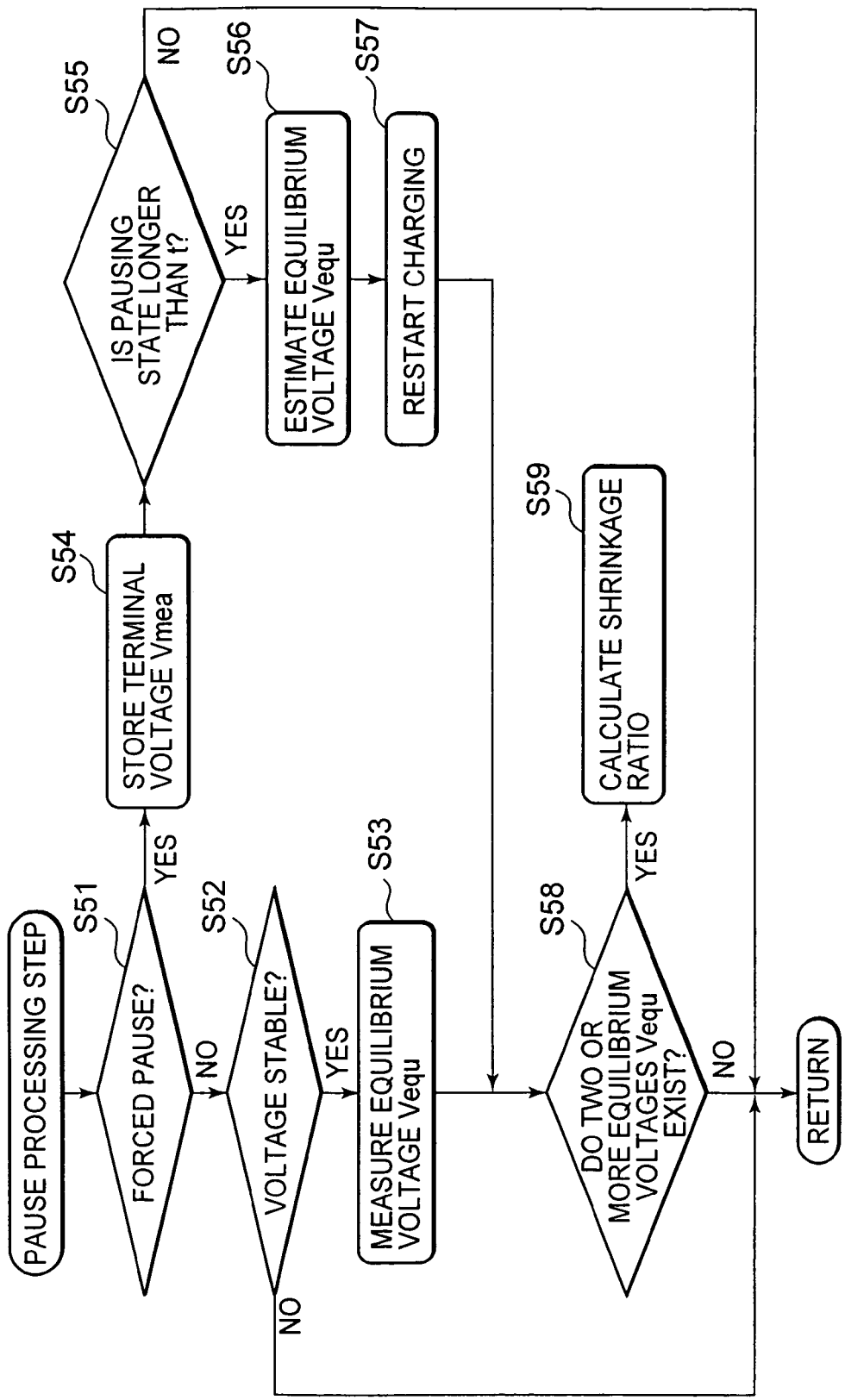
FIG. 15 is a flowchart illustrating the details of a pause processing step shown in FIG. 10.
Figure 16:
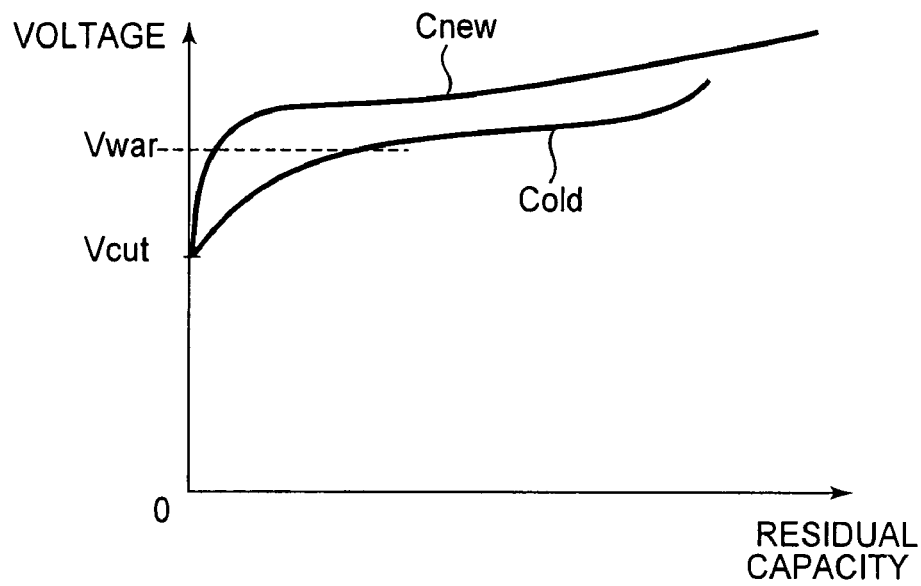
FIG. 16 is a view illustrating a relation between terminal voltages and residual capacities, and illustrates a state in which the characteristic of an initial battery changes to a characteristic of a deteriorated battery.
Figure 17:
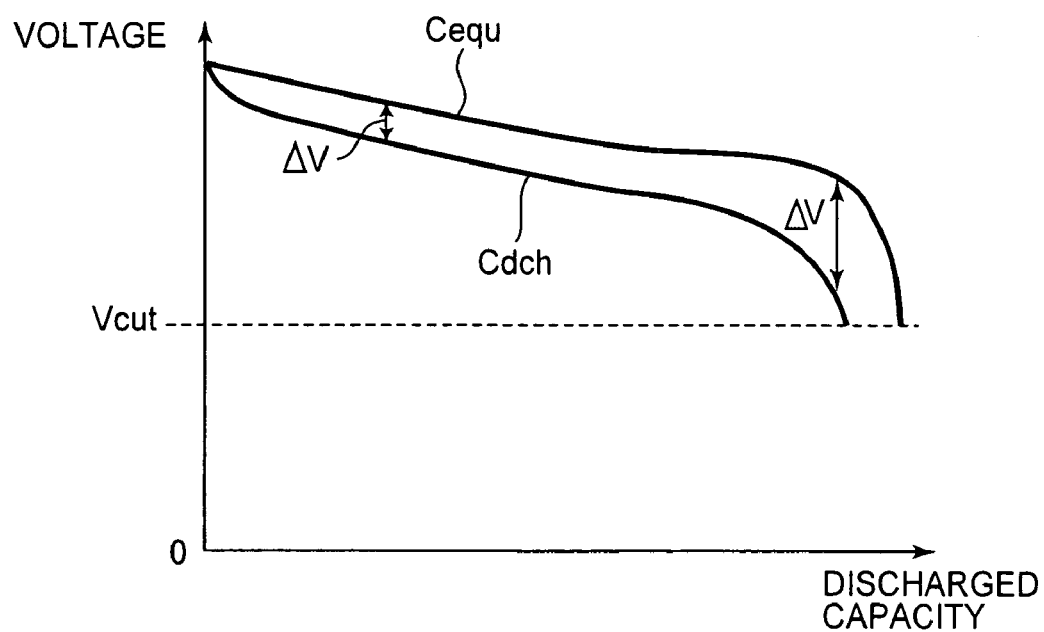
FIG. 17 is a view illustrating relations between voltages and discharged capacities, and illustrates a state in which voltage drops by the internal impedance of a battery change in dependence on discharged capacities.

When the battery capacity calculating apparatus 10 has shifted to the pause processing step, as shown in FIG. 15, at Step S51, the battery capacity calculating apparatus 10 judges whether the present state is a compulsory pause state being compulsorily stopped by the operation unit 15 in the control circuit 13, or whether the present state is a usual pause state.

Here, when the battery capacity calculating apparatus 10 has judged that the present state is a usual pause state, the battery capacity calculating apparatus 10 judges whether the terminal voltage $V_{mea}$ is stabled by the operation unit 15 in the control circuit 13 or not at Step S52. To put it concretely, the battery capacity calculating apparatus 10 judges whether the terminal voltage $V_{mea}$ is stabled or not based on whether or not the pause state is continuing more than a predetermined time, for example, for 30 minutes or more. When the battery capacity calculating apparatus 10 has judged that the terminal voltage $V_{mea}$ is not stabled, the battery capacity calculating apparatus 10 ends the series of the pause processing steps as they are, and shifts the processing thereof to Step S1 in FIG. 10. On the other hand, when the battery capacity calculating apparatus 10 has judged that the terminal voltage $V_{mea}$ is stabled, at Step S53 in FIG. 15, the battery capacity calculating apparatus 10 measures the terminal voltage $V_{mea}$ at that time as the equilibrium voltage $V_{equ}$ with the voltage measuring circuit 11, and the battery capacity calculating apparatus 10 matches the equilibrium voltage $V_{equ}$ with the present discharged capacity $Q_{mea}$ to store them in the storage unit 16 in the control circuit 13. Then, the battery capacity calculating apparatus 10 shifts the processing thereof to Step S58.

On the other hand, when the battery capacity calculating apparatus 10 has judged that the present state is the compulsory pause state at Step S51, the battery capacity calculating apparatus 10 sequentially stores the terminal voltages $V_{mea}$ measured by the voltage measuring circuit 11 in the storage unit 16 in the control circuit 13 at Step S54, and judges how long the time during which the compulsory pause state is continuing is with the operation unit 15 at Step S55.

Here, when the battery capacity calculating apparatus 10 has judged that the time during which the compulsory pause state is continuing is under a predetermined time t, e.g. for 1 minute, the battery capacity calculating apparatus 10 ends the series of the pause processing steps as they are, and shifts the processing thereof to Step S1 in FIG. 10. On the other hand, when the battery capacity calculating apparatus 10 has judged that the time during which the compulsory pause state is continuing is equal to the predetermined time t or more, the battery capacity calculating apparatus 10 estimates the equilibrium voltage $V_{equ}$ based on time changes of the terminal voltage $V_{mea}$ stored in the storage unit 16 in the control circuit 13, and matches the estimated equilibrium voltage $V_{equ}$ with the discharged capacity $Q_{mea}$ at that time to store them in the storage unit 16 at Step S56.

And the battery capacity calculating apparatus 10 supplies a control signal from the control circuit 13 to the switch 14, and makes charging resume at Step S57.

Successively, the battery capacity calculating apparatus 10 judges how much the number of the equilibrium voltages $V_{equ}$ stored in the storage unit 16 in the control circuit 13 is at Step S58.

Here, when the battery capacity calculating apparatus 10 has judged that the number of the equilibrium voltages $V_{equ}$ is less than two, the battery capacity calculating apparatus 10 ends the series of the pause processing steps as they are, and shifts the processing thereof to Step S1 in FIG. 10. On the other hand, when the battery capacity calculating apparatus 10 has judged that the number of the equilibrium voltages $V_{equ}$ is two or more, the battery capacity calculating apparatus 10 calculates the shrinkage ratio S in the equilibrium voltage curve $C_{equ}$ at that time with the operation unit 15 in the control circuit 13, and the battery capacity calculating apparatus 10 ends the series of the pause processing steps to shift the processing thereof to Step S1 in FIG. 10. For example, if the equilibrium voltages currently wanted are $V_1$ and $V_2$ and the discharged capacities corresponding to these equilibrium voltages $V_1$ and $V_2$ are $Q_1$ and $Q_2$ ($Q_2>Q_1$) as previously shown in FIG. 7, the battery capacity calculating apparatus 10 refers to the equilibrium voltage curve of the initial battery stored in the storage unit 16 with the operation unit 15 in the control circuit 13 to obtain the discharged capacities $Q_{ini1}$ and $Q_{ini2}$ at the time when the equilibrium voltages are $V_1$ and $V_2$. Then, the battery capacity calculating apparatus 10 calculates the shrinkage ratio S as $(Q_2-Q_1)/(Q_{ini2}-Q_{ini1})$.

By passing through such a pause processing step, the battery capacity calculating apparatus 10 can obtain the equilibrium voltage $V_{equ}$, and using this, as mentioned above, the battery capacity calculating apparatus 10 can obtain the equilibrium voltage curve of the deteriorated battery in the present state accurately.

As described above, in the battery capacity calculating method shown as an embodiment of the present invention, by measuring the terminal voltages $V_{mea}$ and the current values I during discharging, and by calculating the capacity shifts ΔQ, the discharge curve in the future including the last stage of discharging can be estimated during discharging, and the residual capacities and/or the residual power can be calculated. In particular, in the battery capacity calculating method, an accurate residual capacity in the last stage of discharging, which has not been able to calculate until the battery has almost completely discharged conventionally, can be estimated before the battery has fully discharged independently of environment conditions such as a temperature and the deteriorated state of the battery.

Consequently, by the battery capacity calculating method, the capacity of a battery can be used almost completely and the real use time of an electronic apparatus can be lengthened.

Moreover, by the battery capacity calculating method, a deterioration of a battery, which has conventionally caused by the impossibleness of a full use of the capacity of the deteriorated battery especially, can be reduced, and the life of the battery can be prolonged.

Furthermore, by the battery capacity calculating method, a battery can be made to discharge under its real use environment almost completely. Consequently, no matter how deteriorated a battery is, the accurate fully charged capacity thereof can be calculated by measuring the charged capacities thereof from the time point to the full charging thereof. Consequently, by the battery capacity calculating method, the deterioration degree of a battery can be accurately grasped and thereby it becomes possible to specify the exchange time of the battery accurately for a user of the battery.

Incidentally, the present invention is not limited to the embodiment mentioned above. For example, although the embodiment mentioned above took up and described the lithium ion secondary battery as an example of a battery, the present invention is applicable to arbitrary various secondary batteries.

Moreover, although the embodiment mentioned above describes as if there is one battery as an object for measurement by the battery capacity calculating apparatus 10, the present invention is applicable further to a plurality of batteries connected in series to each other, a plurality of batteries connected in parallel with each other, and a plurality of batteries connected in a form in which series connections and parallel connections are combined. In this case, although it is desirable to measure the terminal voltage and the current value of each battery, and to calculate the residual capacity of each battery in calculation of the residual capacity, the terminal voltage and the current value of the whole of the combined batteries may be measured to calculate the residual capacity of the whole of the combined batteries.

Furthermore, although in the embodiment mentioned above the battery capacity calculating apparatus 10 as a concrete apparatus to which the battery capacity calculating method is applied is described, the present invention can be realized also as a program which can be executed by the electronic apparatus when the electronic apparatus is a personal computer or the like. In this case, the program may be provided in the state where it is pre-installed in the electronic apparatus. For example, the program may be distributed in the state of being recorded on various recording media such as a compact disc-read only memory (CD-ROM), and may be distributed through a predetermined communication circuit.

As mentioned above, it is needless to say that the present invention can be changed suitably in the range which does not deviate from the sprit thereof.

As described above in detail, a battery capacity calculating method, a battery capacity calculating apparatus, and a battery capacity calculating program according to the present invention severally sequentially measure the terminal voltage $V_{mea}$ and the current value I at the time of discharging, and calculate the discharged capacity $Q_{mea}$ and the apparent discharged capacity $Q_{ocv}$ based on the terminal voltage $V_{mea}$ and the current value I, and further estimate the discharge curve $C_{pre}$ in the future including the last stage of discharging during the discharging based on the capacity shift ΔQ, which is the difference between the discharged capacity $Q_{mea}$ and the apparent discharged capacity $\Delta Q_{ocv}$. Thereby each of the battery capacity calculating method, the battery capacity calculating apparatus and the battery capacity calculating program can accurately obtain the residual capacity and/or the residual power, which cannot be calculated until the battery has almost completely discharged conventionally, during discharging in any environment conditions.

Consequently, since the battery capacity calculating method, the battery capacity calculating apparatus and the battery capacity calculating program according to the present invention can use up the capacity of a secondary battery almost completely, they can lengthen the real use time of an electronic apparatus which uses the secondary battery as its power supply, and can reduce the deterioration of the secondary battery to prolong the life thereof.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A battery capacity calculating method for calculating a residual capacity and/or residual power of a secondary battery, comprising:

calculating an equilibrium voltage curve $C_{equ}$ showing a relation between a discharged capacity and an equilibrium voltage in said secondary battery;

measuring a terminal voltage $V_{mea}$ and a current value I of said secondary battery at a time of discharging;

calculating a discharged capacity $Q_{mea}$ of said secondary battery based on the terminal voltage $V_{mea}$ and the current value I;

calculating an apparent equilibrium voltage $V_{ocv}$ by adding a voltage drop $\Delta V_{dc}$ by a direct current resistance $R_{dc}$ to the terminal voltage $V_{mea}$;

calculating an apparent discharged capacity $Q_{ocv}$ corresponding to the apparent equilibrium voltage $V_{ocv}$ calculated based on the equilibrium voltage curve $C_{equ}$;

calculating a capacity shift ΔQ being a difference between the discharged capacity $Q_{mea}$ and the apparent discharged capacity $Q_{ocv}$; and estimating a discharge curve $C_{pre}$ in a future based on the capacity shift ΔQ calculated at said capacity shift calculating step.

2. The battery capacity calculating method according to claim 1, wherein when a state of said battery is close to the last stage of discharging, a reduction rate dQ of a capacity shift to a discharged capacity is calculated based on the discharged capacity $Q_{mea}$ and the capacity shift ΔQ, and the discharge curve $C_{pre}$ in the future is estimated based on the capacity shift ΔQ and the reduction rate dQ.

3. The battery capacity calculating method according to claim 2, wherein the capacity shift ΔQ is expressed by a linear function of the discharged capacity $Q_{mea}$ when the state of said battery is close to the last stage of discharging.

4. The battery capacity calculating method according to claim 1, wherein when a state of said battery is not in the last stage of discharging, the equilibrium voltage $V_{equ}$ corresponding to the discharged capacity $Q_{mea}$ is calculated based on the equilibrium voltage curve $C_{equ}$, and the discharge curve $C_{pre}$ in the future is estimated based on the voltage drop ΔV being the difference between the equilibrium voltage $V_{equ}$ and the terminal voltage $V_{mea}$.

5. The battery capacity calculating method according to claim 4, wherein the discharge curve $C_{pre}$ is estimated by subtracting the voltage drop ΔV from the equilibrium voltage curve $C_{equ}$.

6. The battery capacity calculating method according to claim 4, wherein the discharge curve $C_{pre}$ is estimated using a maximum voltage drop $\Delta V_{max}$ corresponding to a maximum load by present in place of the voltage drop ΔV.

7. The battery capacity calculating method according to claim 1, further comprising calculating the residual capacity and/or the residual power of said secondary battery based on the discharge curve $C_{pre}$.

8. The battery capacity calculating method according to claim 1, further comprising performing a judgment whether a state of said battery is near the last stage of discharging or not based on the apparent equilibrium voltage $V_{ocv}$ to switch an estimating method of the discharge curve $C_{pre}$ according to a judgment result.

9. The battery capacity calculating method according to claim 8, wherein the apparent equilibrium voltage $V_{ocv}$ is compared with a predetermined threshold value to perform the judgment whether the state of said battery is near the last stage of discharging or not.

10. The battery capacity calculating method according to claim 1, wherein the direct current resistance $R_{dc}$ is calculated based on voltage changes according to current changes.

11. The battery capacity calculating method according to claim 1, wherein the direct current resistance $R_{dc}$ is calculated based on an average voltage and an average current value.

12. The battery capacity calculating method according to claim 1, wherein the equilibrium voltage curve $C_{equ}$ is calculated based on equilibrium voltages at least two points and a capacity between the equilibrium voltages.

13. The battery capacity calculating method according to claim 12, wherein a shrinkage ratio S expressed by a quotient obtained by dividing a fully charged capacity of the secondary battery by a fully charged capacity of an initial battery which is not deteriorated based on the equilibrium voltages at the at least two points and a capacity between the equilibrium voltages.

14. The battery capacity calculating method according to claim 1, wherein charging is compulsorily stopped and an equilibrium voltage is obtained based on a subsequent voltage change.

15. The battery capacity calculating method according to claim 1, wherein the calculated residual capacity and/or the calculated residual power are transmitted to an electronic apparatus using said secondary battery as its power supply.

16. A battery capacity calculating apparatus for calculating a residual capacity and/or residual power of a secondary battery, comprising:
voltage measuring means for measuring a terminal voltage $V_{mea}$ of said secondary battery at a time of discharging;
current measuring means for measuring a current value I of said secondary battery at the time of discharging; and
operation processing means for calculating the residual capacity and/or the residual power of said secondary battery,
wherein said operation processing means calculates an equilibrium voltage curve $C_{equ}$ showing a relation between a discharged capacity and an equilibrium voltage in said secondary battery, calculates a discharged capacity $Q_{mea}$ of said secondary battery based on the terminal voltage $V_{mea}$ measured with said voltage measuring means and the current value I measured with said current measuring means, calculates an apparent equilibrium voltage $V_{ocv}$ by adding a voltage drop $\Delta V_{dc}$ by a direct current resistance $R_{dc}$ to the terminal voltage $V_{mea}$, calculates an apparent discharged capacity $Q_{ocv}$ corresponding to the apparent equilibrium voltage $V_{ocv}$ based on the equilibrium voltage curve $C_{equ}$, calculates a capacity shift $\Delta Q$ being a difference between the discharged capacity $Q_{mea}$ and the apparent discharged capacity $Q_{ocv}$, and estimates a discharge curve $C_{pre}$ in a future based on the capacity shift $\Delta Q$.

17. The battery capacity calculating apparatus according to claim 16, wherein, when a state of said battery is close to the last stage of discharging, said operation processing means calculates a reduction rate dQ of a capacity shift to a discharged capacity based on the discharged capacity $Q_{mea}$ and the capacity shift $\Delta Q$, and estimates the discharge curve $C_{pre}$ in the future based on the capacity shift $\Delta Q$ and the reduction rate dQ.

18. The battery capacity calculating apparatus according to claim 17, wherein the capacity shift $\Delta Q$ is expressed by a linear function of the discharged capacity $Q_{mea}$ when the state of said battery is close to the last stage of discharging.

19. The battery capacity calculating apparatus according to claim 16, wherein, when a state of said battery is not in the last stage of discharging, said operation processing means calculates the equilibrium voltage $V_{equ}$ corresponding to the discharged capacity $Q_{mea}$ based on the equilibrium voltage curve $C_{equ}$, and estimates the discharge curve $C_{pre}$ in the future based on the voltage drop $\Delta V$ being the difference between the equilibrium voltage $V_{equ}$ and the terminal voltage $V_{mea}$.

20. The battery capacity calculating apparatus according to claim 19, wherein said operation processing means estimates the discharge curve $C_{pre}$ by subtracting the voltage drop $\Delta V$ from the equilibrium voltage curve $C_{equ}$.

21. The battery capacity calculating apparatus according to claim 19, wherein said operation processing means estimates the discharge curve $C_{pre}$ using a maximum voltage drop $\Delta V_{max}$ corresponding to a maximum load by present in place of the voltage drop $\Delta V$.

22. The battery capacity calculating apparatus according to claim 16, wherein said operation processing means calculates a residual capacity and/or the residual power of said secondary battery based on the estimated discharge curve $C_{pre}$.

23. The battery capacity calculating apparatus according to claim 16, wherein said operation processing means performs a judgment whether a state of said battery is near the last stage of discharging or not based on the apparent equilibrium voltage $V_{ocv}$ to switch an estimating method of the discharge curve $C_{pre}$ according to a judgment result.

24. The battery capacity calculating apparatus according to claim 23, wherein said operation processing means compares the apparent equilibrium voltage $V_{ocv}$ with a predetermined threshold value to perform the judgment whether the state of said battery is near the last stage of discharging or not.

25. The battery capacity calculating apparatus according to claim 16, wherein said operation processing means calculates the direct current resistance $R_{dc}$ based on voltage changes according to current changes.

26. The battery capacity calculating apparatus according to claim 16, wherein said operation processing means calculates the direct current resistance $R_{dc}$ based on an average voltage and an average current value.

27. The battery capacity calculating apparatus according to claim 16, wherein said operation processing means calculates the equilibrium voltage curve $C_{equ}$ based on equilibrium voltages at least two points and a capacity between the equilibrium voltages.

28. The battery capacity calculating apparatus according to claim 27, wherein said operation processing means calculates a shrinkage ratio S expressed by a quotient obtained by dividing a fully charged capacity of said secondary battery by a fully charged capacity of an initial battery which is not deteriorated based on the equilibrium voltages at the at least two points and a capacity between the equilibrium voltages.

29. The battery capacity calculating apparatus according to claim 16, wherein said operation processing means compulsorily stops charging and obtains an equilibrium voltage based on a subsequent voltage change.

30. The battery capacity calculating apparatus according to claim 16, further comprising transmitting means for transmitting the residual capacity and/or the residual power calculated by said operation processing means to an electronic apparatus using said secondary battery as its power supply.

31. A battery capacity calculating program capable of being executed by a computer for calculating a residual capacity and/or residual power of a secondary battery, comprising:

equilibrium voltage curve calculating processing for calculating an equilibrium voltage curve $C_{equ}$ showing a relation between a discharged capacity and an equilibrium voltage of said secondary battery;

voltage current measuring processing for measuring a terminal voltage $V_{mea}$ and a current value I of said secondary battery at a time of discharging;

discharged capacity calculating processing for calculating a discharged capacity $Q_{mea}$ of said secondary battery based on the terminal voltage $V_{mea}$ and the current value I, both measured by said voltage current measuring processing;

apparent equilibrium voltage calculating processing for calculating an apparent equilibrium voltage $V_{ocd}$ by adding a voltage drop $\Delta V_{dc}$ by a direct current resistance $R_{dc}$ to the terminal voltage $V_{mea}$;

apparent discharged capacity calculating processing for calculating an apparent discharged capacity $Q_{ocv}$ corresponding to the apparent equilibrium voltage $V_{ocv}$ calculated by said equilibrium voltage calculating processing based on said equilibrium voltage curve $C_{equ}$ calculated by said equilibrium voltage curve calculating processing;

capacity shift calculating processing for calculating a capacity shift $\Delta Q$ being a difference between the discharged capacity $Q_{mea}$ and the apparent discharged capacity $Q_{ocv}$; and estimating processing for estimating a discharge curve $C_{pre}$ in a future based on the capacity shift $\Delta Q$ calculated by said capacity shift calculating processing.

\* \* \* \* \*